(12) United States Patent
    Sung

(10) Patent No.: US 10,741,248 B2
(45) Date of Patent: Aug. 11, 2020

(54) GLOBAL WORDLINE DECODER AND SEMICONDUCTOR DEVICE HAVING THE SAME

(71) Applicant: SK hynix Inc., Gyeonggi-do (KR)

(72) Inventor: Moon Soo Sung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/934,557

(22) Filed: Mar. 23, 2018

(65) Prior Publication Data

US 2019/0051356 A1    Feb. 14, 2019

(30) Foreign Application Priority Data

Aug. 11, 2017 (KR) .................. 10-2017-0102476

(51) Int. Cl.

| | | |
|---|---|---|
| *G11C 16/08* | (2006.01) | |
| *G11C 16/04* | (2006.01) | |
| *G11C 8/10* | (2006.01) | |
| *G11C 8/12* | (2006.01) | |
| *G11C 16/10* | (2006.01) | |
| *G11C 11/56* | (2006.01) | |
| *G11C 8/14* | (2006.01) | |
| *G11C 16/26* | (2006.01) | |
| *G11C 5/14* | (2006.01) | |

(52) U.S. Cl.
    CPC ............ *G11C 16/08* (2013.01); *G11C 8/10* (2013.01); *G11C 8/12* (2013.01); *G11C 8/14* (2013.01); *G11C 11/5628* (2013.01); *G11C 11/5642* (2013.01); *G11C 16/0483* (2013.01); *G11C 16/10* (2013.01); *G11C 16/26* (2013.01); *G11C 5/147* (2013.01)

(58) Field of Classification Search
    CPC .. G11C 5/063; G11C 8/10; G11C 8/08; G11C 16/08; G11C 16/0483
    USPC .............................. 365/185.11, 185.13, 185.23
    See application file for complete search history.

(56) References Cited

U.S. PATENT DOCUMENTS

| | | | | |
|---|---|---|---|---|
| 2012/0230108 A1* | 9/2012 | Missiroli | ................ | G11C 16/12 365/185.18 |
| 2012/0268997 A1* | 10/2012 | Choi | .................. | G11C 16/0483 365/185.18 |

FOREIGN PATENT DOCUMENTS

| | | |
|---|---|---|
| KR | 100938094 | 1/2010 |
| KR | 1020130022228 | 3/2013 |
| KR | 1020130036555 | 4/2013 |
| KR | 1020140028728 | 3/2014 |

* cited by examiner

*Primary Examiner* — Alfredo Bermudez Lozada
(74) *Attorney, Agent, or Firm* — IP & T Group LLP

(57) ABSTRACT

A global word line decoder may include a voltage switching unit and a plane switching unit. The voltage switching unit may decode a plurality of operating voltages to output a selected voltage and an unselected voltage, and the plane switching unit may receive the selected voltage and the unselected voltage, and decode the selected voltage and the unselected voltage to output decoded voltages to a global word line coupled to a selected plane, among a plurality of planes. The selected voltage may include a first pre-decoded voltage and a second pre-decoded voltage, and the plane switching unit may swap and output the first pre-decoded voltage and the second pre-decoded voltage according to a position of a selected word line.

19 Claims, 18 Drawing Sheets

FIG. 12A

| | | | |
|---|---|---|---|
| UNSEL. WL switch | VUN | GWL_P1<192> | VPASS |
| | ... | ... | ... |
| | VUN | GWL_P1<33> | VPASS |
| SEL. WL switch<br><br>Dec_B | VSEL<32> | GWL_P1<32> | VPASS |
| | VSEL<31> | GWL_P1<31> | VPASS |
| | VSEL<30> | GWL_P1<30> | VPASS |
| | VSEL<29> | GWL_P1<29> | VPASS |
| | VSEL<28> | GWL_P1<28> | VPASS |
| | VSEL<27> | GWL_P1<27> | VPASS |
| | VSEL<26> | GWL_P1<26> | VPASS |
| | VSEL<25> | GWL_P1<25> | VPASS |
| | VSEL<24> | GWL_P1<24> | VPASS |
| | VSEL<23> | GWL_P1<23> | VPASS |
| | VSEL<22> | GWL_P1<22> | VPASS |
| | VSEL<21> | GWL_P1<21> | VPASS |
| | VSEL<20> | GWL_P1<20> | VPASS |
| | VSEL<19> | GWL_P1<19> | VPASS |
| | VSEL<18> | GWL_P1<18> | VPASS |
| | VSEL<17> | GWL_P1<17> | VPASS |
| SEL. WL switch<br><br>Dec_A | VSEL<16> | GWL_P1<16> | VPASS |
| | VSEL<15> | GWL_P1<15> | VPASS |
| | VSEL<14> | GWL_P1<14> | VPASS |
| | VSEL<13> | GWL_P1<13> | VPASS |
| | VSEL<12> | GWL_P1<12> | VPASS |
| | VSEL<11> | GWL_P1<11> | VPASS |
| | VSEL<10> | GWL_P1<10> | VPASS |
| | VSEL<9> | GWL_P1<9> | VPASS |
| | VSEL<8> | GWL_P1<8> | VPASS |
| | VSEL<7> | GWL_P1<7> | VPASS |
| | VSEL<6> | GWL_P1<6> | VPASS |
| | VSEL<5> | GWL_P1<5> | VPASS |
| | VSEL<4> | GWL_P1<4> | VPASS |
| Local S.B. | VSEL<3> | GWL_P1<3> | VLSB2 |
| Local S.B. | VSEL<2> | GWL_P1<2> | VLSB1 |
| selected → | VSEL<1> | GWL_P1<1> | VPGM |

FIG. 12B

| | | | |
|---|---|---|---|
| UNSEL. WL switch | VUN | GWL_P1<192> | VPASS |
| | ... | ... | ... |
| | VUN | GWL_P1<33> | VPASS |
| Local S.B. | VSEL<32> | GWL_P1<32> | VLSB2 |
| Local S.B. | VSEL<31> | GWL_P1<31> | VLSB1 |
| selected → | VSEL<30> | GWL_P1<30> | VPGM |
| Local S.B. | VSEL<29> | GWL_P1<29> | VLSB1 |
| Local S.B. | VSEL<28> | GWL_P1<28> | VLSB2 |
| | VSEL<27> | GWL_P1<27> | VPASS |
| | VSEL<26> | GWL_P1<26> | VPASS |
| SEL. WL switch | VSEL<25> | GWL_P1<25> | VPASS |
| | VSEL<24> | GWL_P1<24> | VPASS |
| | VSEL<23> | GWL_P1<23> | VPASS |
| Dec_B | VSEL<22> | GWL_P1<22> | VPASS |
| | VSEL<21> | GWL_P1<21> | VPASS |
| | VSEL<20> | GWL_P1<20> | VPASS |
| | VSEL<19> | GWL_P1<19> | VPASS |
| | VSEL<18> | GWL_P1<18> | VPASS |
| | VSEL<17> | GWL_P1<17> | VPASS |
| | VSEL<16> | GWL_P1<16> | VPASS |
| | VSEL<15> | GWL_P1<15> | VPASS |
| | VSEL<14> | GWL_P1<14> | VPASS |
| | VSEL<13> | GWL_P1<13> | VPASS |
| | VSEL<12> | GWL_P1<12> | VPASS |
| SEL. WL switch | VSEL<11> | GWL_P1<11> | VPASS |
| | VSEL<10> | GWL_P1<10> | VPASS |
| | VSEL<9> | GWL_P1<9> | VPASS |
| Dec_A | VSEL<8> | GWL_P1<8> | VPASS |
| | VSEL<7> | GWL_P1<7> | VPASS |
| | VSEL<6> | GWL_P1<6> | VPASS |
| | VSEL<5> | GWL_P1<5> | VPASS |
| | VSEL<4> | GWL_P1<4> | VPASS |
| | VSEL<3> | GWL_P1<3> | VPASS |
| | VSEL<2> | GWL_P1<2> | VPASS |
| | VSEL<1> | GWL_P1<1> | VPASS |

FIG. 12C

| | | | |
|---|---|---|---|
| UNSEL. WL switch | VUN | GWL_P1<192> | VPASS |
| | ... | ... | ... |
| | VUN | GWL_P1<49> | VPASS |
| SEL. WL switch Dec_A | VSEL<16> | GWL_P1<48> | VPASS |
| | VSEL<15> | GWL_P1<47> | VPASS |
| | VSEL<14> | GWL_P1<46> | VPASS |
| | VSEL<13> | GWL_P1<45> | VPASS |
| | VSEL<12> | GWL_P1<44> | VPASS |
| | VSEL<11> | GWL_P1<43> | VPASS |
| | VSEL<10> | GWL_P1<42> | VPASS |
| | VSEL<9> | GWL_P1<41> | VPASS |
| | VSEL<8> | GWL_P1<40> | VPASS |
| | VSEL<7> | GWL_P1<39> | VPASS |
| | VSEL<6> | GWL_P1<38> | VPASS |
| | VSEL<5> | GWL_P1<37> | VPASS |
| | VSEL<4> | GWL_P1<36> | VPASS |
| | VSEL<3> | GWL_P1<35> | VPASS |
| | VSEL<2> | GWL_P1<34> | VPASS |
| Local S.B. | VSEL<1> | GWL_P1<33> | VLSB2 |
| Local S.B. | VSEL<32> | GWL_P1<32> | VLSB1 |
| selected → | VSEL<31> | GWL_P1<31> | VPGM |
| Local S.B. | VSEL<30> | GWL_P1<30> | VLSB1 |
| Local S.B. | VSEL<29> | GWL_P1<29> | VLSB2 |
| SEL. WL switch Dec_B | VSEL<28> | GWL_P1<28> | VPASS |
| | VSEL<27> | GWL_P1<27> | VPASS |
| | VSEL<26> | GWL_P1<26> | VPASS |
| | VSEL<25> | GWL_P1<25> | VPASS |
| | VSEL<24> | GWL_P1<24> | VPASS |
| | VSEL<23> | GWL_P1<23> | VPASS |
| | VSEL<22> | GWL_P1<22> | VPASS |
| | VSEL<21> | GWL_P1<21> | VPASS |
| | VSEL<20> | GWL_P1<20> | VPASS |
| | VSEL<19> | GWL_P1<19> | VPASS |
| | VSEL<18> | GWL_P1<18> | VPASS |
| | VSEL<17> | GWL_P1<17> | VPASS |
| UNSEL. WL switch | VUN | GWL_P1<16> | VPASS |
| | ... | ... | ... |
| | VUN | GWL_P1<2> | VPASS |
| | VUN | GWL_P1<1> | VPASS |

FIG. 12D

| | | | |
|---|---|---|---|
| UNSEL. WL switch | VUN | GWL_P1<192> | VPASS |
| | ... | ... | ... |
| | VUN | GWL_P1<49> | VPASS |
| SEL. WL switch<br><br>Dec_A | VSEL<16> | GWL_P1<48> | VPASS |
| | VSEL<15> | GWL_P1<47> | VPASS |
| | VSEL<14> | GWL_P1<46> | VPASS |
| | VSEL<13> | GWL_P1<45> | VPASS |
| | VSEL<12> | GWL_P1<44> | VPASS |
| | VSEL<11> | GWL_P1<43> | VPASS |
| | VSEL<10> | GWL_P1<42> | VPASS |
| | VSEL<9> | GWL_P1<41> | VPASS |
| | VSEL<8> | GWL_P1<40> | VPASS |
| | VSEL<7> | GWL_P1<39> | VPASS |
| | VSEL<6> | GWL_P1<38> | VPASS |
| | VSEL<5> | GWL_P1<37> | VPASS |
| Local S.B. | VSEL<4> | GWL_P1<36> | VLSB2 |
| Local S.B. | VSEL<3> | GWL_P1<35> | VLSB1 |
| selected → | VSEL<2> | GWL_P1<34> | VPGM |
| Local S.B. | VSEL<1> | GWL_P1<33> | VLSB1 |
| Local S.B. | VSEL<32> | GWL_P1<32> | VLSB2 |
| SEL. WL switch<br><br>Dec_B | VSEL<31> | GWL_P1<31> | VPASS |
| | VSEL<30> | GWL_P1<30> | VPASS |
| | VSEL<29> | GWL_P1<29> | VPASS |
| | VSEL<28> | GWL_P1<28> | VPASS |
| | VSEL<27> | GWL_P1<27> | VPASS |
| | VSEL<26> | GWL_P1<26> | VPASS |
| | VSEL<25> | GWL_P1<25> | VPASS |
| | VSEL<24> | GWL_P1<24> | VPASS |
| | VSEL<23> | GWL_P1<23> | VPASS |
| | VSEL<22> | GWL_P1<22> | VPASS |
| | VSEL<21> | GWL_P1<21> | VPASS |
| | VSEL<20> | GWL_P1<20> | VPASS |
| | VSEL<19> | GWL_P1<19> | VPASS |
| | VSEL<18> | GWL_P1<18> | VPASS |
| | VSEL<17> | GWL_P1<17> | VPASS |
| UNSEL. WL switch | VUN | GWL_P1<16> | VPASS |
| | ... | ... | ... |
| | VUN | GWL_P1<2> | VPASS |
| | VUN | GWL_P1<1> | VPASS |

FIG. 12E

| | | | |
|---|---|---|---|
| UNSEL. WL switch | VUN | GWL_P1<192> | VPASS |
| | ... | ... | ... |
| | VUN | GWL_P1<49> | VPASS |
| | VSEL<16> | GWL_P1<48> | VLSB2 |
| | VSEL<15> | GWL_P1<47> | VLSB1 |
| | VSEL<14> | GWL_P1<46> | VPGM |
| | VSEL<13> | GWL_P1<45> | VLSB1 |
| | VSEL<12> | GWL_P1<44> | VLSB2 |
| SEL. WL switch | VSEL<11> | GWL_P1<43> | VPASS |
| | VSEL<10> | GWL_P1<42> | VPASS |
| | VSEL<9> | GWL_P1<41> | VPASS |
| Dec_A | VSEL<8> | GWL_P1<40> | VPASS |
| | VSEL<7> | GWL_P1<39> | VPASS |
| | VSEL<6> | GWL_P1<38> | VPASS |
| | VSEL<5> | GWL_P1<37> | VPASS |
| | VSEL<4> | GWL_P1<36> | VPASS |
| | VSEL<3> | GWL_P1<35> | VPASS |
| | VSEL<2> | GWL_P1<34> | VPASS |
| Local S.B. | VSEL<1> | GWL_P1<33> | VPASS |
| Local S.B. selected→ | VSEL<32> | GWL_P1<32> | VPASS |
| | VSEL<31> | GWL_P1<31> | VPASS |
| Local S.B. | VSEL<30> | GWL_P1<30> | VPASS |
| Local S.B. | VSEL<29> | GWL_P1<29> | VPASS |
| | VSEL<28> | GWL_P1<28> | VPASS |
| SEL. WL switch | VSEL<27> | GWL_P1<27> | VPASS |
| | VSEL<26> | GWL_P1<26> | VPASS |
| | VSEL<25> | GWL_P1<25> | VPASS |
| Dec_B | VSEL<24> | GWL_P1<24> | VPASS |
| | VSEL<23> | GWL_P1<23> | VPASS |
| | VSEL<22> | GWL_P1<22> | VPASS |
| | VSEL<21> | GWL_P1<21> | VPASS |
| | VSEL<20> | GWL_P1<20> | VPASS |
| | VSEL<19> | GWL_P1<19> | VPASS |
| | VSEL<18> | GWL_P1<18> | VPASS |
| | VSEL<17> | GWL_P1<17> | VPASS |
| | VUN | GWL_P1<16> | VPASS |
| UNSEL. WL switch | ... | ... | ... |
| | VUN | GWL_P1<2> | VPASS |
| | VUN | GWL_P1<1> | VPASS |

FIG. 12F

| | | | |
|---|---|---|---|
| UNSEL. WL switch | VUN | GWL_P1<192> | VPASS |
| | ... | ... | ... |
| | VUN | GWL_P1<65> | VPASS |
| SEL. WL switch<br><br>Dec_B | VSEL<32> | GWL_P1<64> | VPASS |
| | VSEL<31> | GWL_P1<63> | VPASS |
| | VSEL<30> | GWL_P1<62> | VPASS |
| | VSEL<29> | GWL_P1<61> | VPASS |
| | VSEL<28> | GWL_P1<60> | VPASS |
| | VSEL<27> | GWL_P1<59> | VPASS |
| | VSEL<26> | GWL_P1<58> | VPASS |
| | VSEL<25> | GWL_P1<57> | VPASS |
| | VSEL<24> | GWL_P1<56> | VPASS |
| | VSEL<23> | GWL_P1<55> | VPASS |
| | VSEL<22> | GWL_P1<54> | VPASS |
| | VSEL<21> | GWL_P1<53> | VPASS |
| | VSEL<20> | GWL_P1<52> | VPASS |
| | VSEL<19> | GWL_P1<51> | VPASS |
| | VSEL<18> | GWL_P1<50> | VPASS |
| Local S.B. | VSEL<17> | GWL_P1<49> | VLSB2 |
| Local S.B. | VSEL<16> | GWL_P1<48> | VLSB1 |
| selected → | VSEL<15> | GWL_P1<47> | VPGM |
| Local S.B. | VSEL<14> | GWL_P1<46> | VLSB1 |
| Local S.B. | VSEL<13> | GWL_P1<45> | VLSB2 |
| SEL. WL switch<br><br>Dec_A | VSEL<12> | GWL_P1<44> | VPASS |
| | VSEL<11> | GWL_P1<43> | VPASS |
| | VSEL<10> | GWL_P1<42> | VPASS |
| | VSEL<9> | GWL_P1<41> | VPASS |
| | VSEL<8> | GWL_P1<40> | VPASS |
| | VSEL<7> | GWL_P1<39> | VPASS |
| | VSEL<6> | GWL_P1<38> | VPASS |
| | VSEL<5> | GWL_P1<37> | VPASS |
| | VSEL<4> | GWL_P1<36> | VPASS |
| | VSEL<3> | GWL_P1<35> | VPASS |
| | VSEL<2> | GWL_P1<34> | VPASS |
| | VSEL<1> | GWL_P1<33> | VPASS |
| UNSEL. WL switch | VUN | GWL_P1<32> | VPASS |
| | ... | ... | ... |
| | VUN | GWL_P1<2> | VPASS |
| | VUN | GWL_P1<1> | VPASS |

GLOBAL WORDLINE DECODER AND SEMICONDUCTOR DEVICE HAVING THE SAME

CROSS-REFERENCE TO RELATED APPLICATION

The present application claims priority under 35 U.S.C. § 119(a) to Korean patent application number 10-2017-0102476, filed on Aug. 11, 2017, which is herein incorporated by reference in its entirety.

BACKGROUND

Field

Various embodiments of the invention relate generally to a semiconductor device. Particularly, various embodiments relate to a decoder and a semiconductor device having the same.

Description of Related Art

A semiconductor device may have a two-dimensional structure in which a string is arranged in the horizontal direction with respect to the semiconductor substrate, or a three-dimensional structure in which a string is arranged in the vertical direction with respect to the semiconductor substrate. Three-dimensional semiconductor devices may be developed to overcome the limited degree of integration of two-dimensional semiconductor devices, and may include a plurality of memory cells vertically stacked on the semiconductor substrate.

SUMMARY

Various embodiments are directed to a decoder capable of reducing the chip size.

Another embodiment of the invention may provide a semiconductor device capable of reducing the chip size.

According to an embodiment, a decoder may include a voltage switching unit and a plane switching unit. The voltage switching unit may decode a plurality of operating voltages to output a selected voltage and an unselected voltage, and the plane switching unit may receive the selected voltage and the unselected voltage, and decode the selected voltage and the unselected voltage to output decoded voltages to a global word line coupled to a selected plane, among a plurality of planes. The selected voltage may include a first pre-decoded voltage and a second pre-decoded voltage, and the plane switching unit may swap an order and output the first pre-decoded voltage and the second pre-decoded voltage according to a position of a selected word line.

The voltage switching unit may include a selected voltage switching unit and an unselected voltage switching unit. The selected voltage switching unit may generate the first pre-decoded voltage and the second pre-decoded voltage based on the plurality of operating voltages that are decoded. The unselected voltage switching unit may generate the unselected voltage based on the plurality of operating voltages that are decoded.

According to another embodiment, a semiconductor device may include a plurality of global word lines, a voltage generator, a voltage switching unit, a plane switching unit, and a control logic. The voltage generator may generate a plurality of operating voltages having different levels. The voltage switching unit may decode the plurality of operating voltages to output a selected voltage and an unselected voltage. The plane switching unit may receive the selected voltage and the unselected voltage, and decode and output the selected voltage and the unselected voltage to a global word line coupled to a selected plane, among a plurality of planes. The control logic may control operations of the voltage generator, the voltage switching unit and the plane switching unit. The plane switching unit may swap an order and output the first pre-decoded voltage and the second pre-decoded voltage according to a position of a selected word line.

According to still another embodiment, a decoder may include a voltage switching unit and a plane switching unit. The voltage switching unit may decode a plurality of operating voltages to output a selected voltage and an unselected voltage. The selected voltage may include a first pre-decoded voltage and a second pre-decoded voltage. The plane switching unit may receive the selected voltage and the unselected voltage, and decode the selected voltage and the unselected voltage to output decoded voltages to a global word line coupled to a selected plane, among a plurality of planes. The plane switching unit may include groups of switches, a first group of switches may receive the first pre-decoded voltage, a second group of switches may receive the second pre-decoded voltage, and a third group of switches may receive the first pre-decoded voltage. Either the first group of switches or the third group of switches may alternatively output the first pre-decoded voltage according to a position of a selected word line.

BRIEF DESCRIPTION OF THE DRAWINGS

FIGS. 12A to 12F are tables illustrating operations of a global word line decoder shown in FIG. 6;

DETAILED DESCRIPTION

Figure 1:
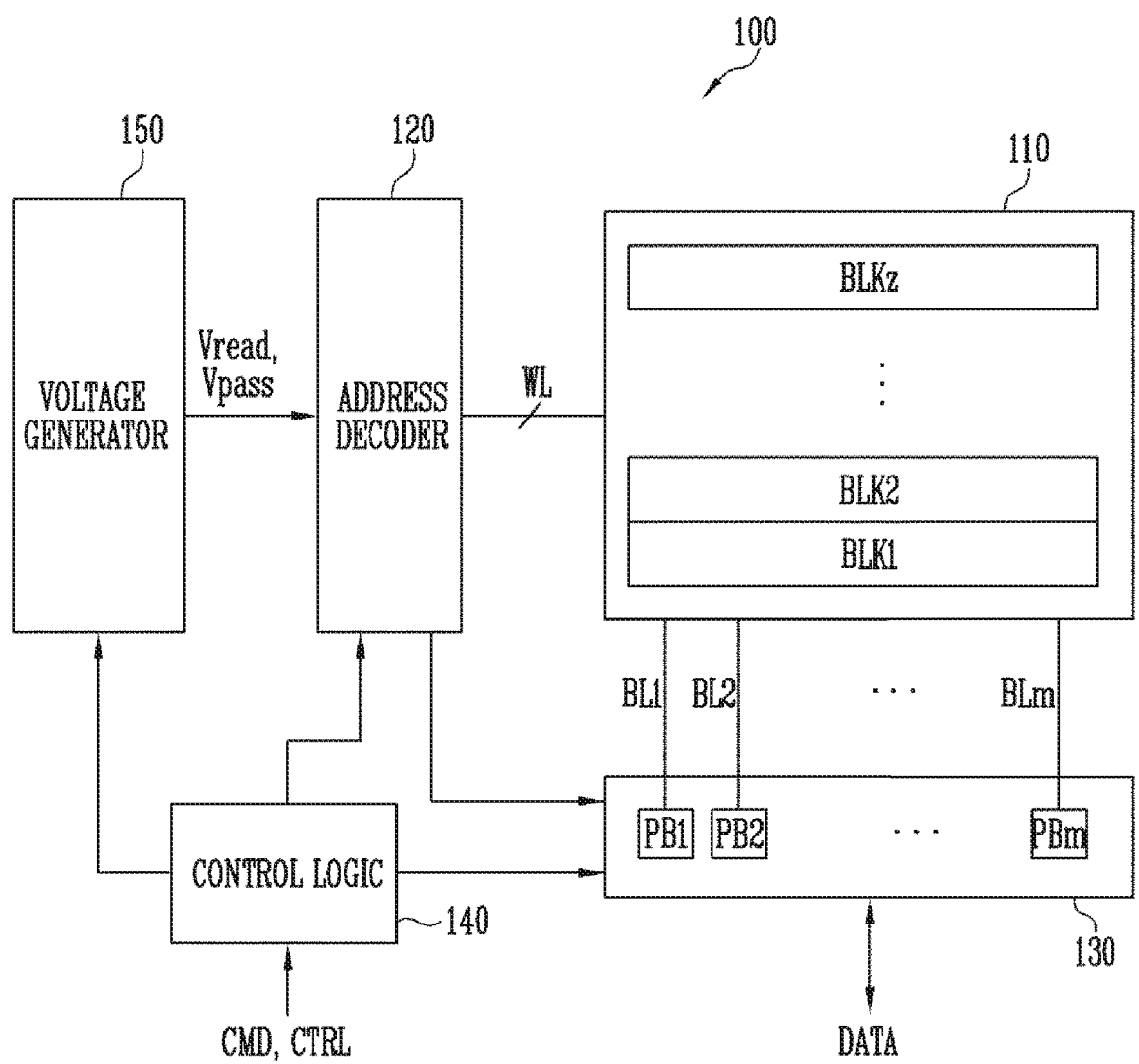
FIG. 1 is a block diagram illustrating a semiconductor device in accordance with one embodiment of the present disclosure.

Hereinafter, various exemplary embodiments will be described in detail with reference to the accompanying drawings. In the drawings, thicknesses and lengths of components may be exaggerated for convenience of illustration. In the following description, a detailed description of related functions and constitutions may be omitted for simplicity and conciseness. Like reference numerals refer to like elements throughout the specification and drawings.

It is also noted that in this specification, "connected/coupled" refers to one component not only directly coupling another component but also indirectly coupling another component through an intermediate component. In addition, throughout the specification, when it is said that a certain part "includes" a certain element, this does not exclude other elements from being included but the certain part may further include another element unless particularly described otherwise.

Example embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the example embodiments to those skilled in the art.

Hereinafter, preferred embodiments of the invention will be described in detail with reference to the accompanying drawings.

FIG. 1 is a block diagram illustrating an embodiment of a semiconductor device 100.

Referring to FIG. 1, the semiconductor device 100 may include a memory cell array 110, an address decoder 120, a read and write circuit 130, a control logic 140, and a voltage generator 150.

The memory cell array 110 may include a plurality of memory blocks BLK1 to BLKz. Though not shown in detail in FIG. 1, the memory cell array 110 may include a plurality of planes, and each of the planes may include a plurality of memory blocks. An exemplary configuration of each of the planes and each of the memory blocks is described with reference to FIG. 2.

The memory blocks BLK1 to BLKz may be coupled to the address decoder 120 through word lines WL. The plurality of memory blocks BLK1 to BLKz may be coupled to the read/write circuit 130 through bit lines BL1 to BLm. Each of the plurality of memory blocks BLK1 to BLKz may include a plurality of memory cells.

According to an embodiment, the plurality of memory cells may be non-volatile memory cells, and the memory cell array 110 may have a two-dimensional structure. According to another embodiment, the plurality of memory cells may be non-volatile memory cells having a vertical channel structure, and the memory cell array 110 may have a three-dimensional structure. Each of the plurality of memory cells included in the memory cell array 110 may store at least 1-bit data. Depending on an embodiment, each of the plurality of memory cells included in the memory cell array 110 may be a single-level cell (SLC) storing 1-bit data, may be a multi-level cell (MLC) storing 2-bit data, may be a triple-level cell (TLC) storing 3-bit data, may be a quad-level cell (QLC) storing 4-bit data, or may store 5 or more bits of data.

The address decoder 120, the read and write circuit 130, and the control logic 140 may operate as a peripheral circuit driving the memory cell array 110. The address decoder 120 may be coupled to the memory cell array 110 through word lines WL. The address decoder 120 may operate in response to control of the control logic 140. The address decoder 120 may receive an address through a global word line decoder (not illustrated), a plane decoder, and an input/output buffer (not illustrated) in the semiconductor device 100.

The address decoder 120 may be configured to decode a block address of the received address. The address decoder 120 may select at least one memory block according to the decoded block address. In addition, during a read operation, the address decoder 120 may apply a read voltage Vread generated by the voltage generator 150 to a selected word line of the selected memory block and a pass voltage Vpass to unselected word lines. In addition, during a program verify operation, a verify voltage generated by the voltage generator 150 may be applied to the selected word line of the selected memory block, and the pass voltage Vpass may be applied to the unselected word lines.

The address decoder 120 may decode a column address of the received address. The address decoder 120 may transfer the decoded column address to the read and write circuit 130.

A read operation and a program operation of the semiconductor device 100 may be performed in units of pages. An address received at the request of a read operation and a program operation may include a block address, a row address, and a column address. The address decoder 120 may select one memory block and one word line in response to the block address and the row address. The column address may be decoded by the address decoder 120 and provided to the read and write circuit 130.

The address decoder 120 may include a block decoder, a row decoder, a column decoder, and an address buffer.

The read and write circuit 130 may include a plurality of page buffers PB1 to PBm. The read and write circuit 130 may operate as a read circuit during a read operation of the memory cell array 110 and a write circuit during a write operation thereof. The page buffers PB1 to PBm may be coupled to the memory cell array 110 through the bit lines BL1 to BLm. In order to sense threshold voltages of memory cells during a read operation and a program verify operation, the page buffers PB1 to PBm may continuously supply a sensing current to bit lines coupled to memory cells and sense changes in amount of current caused by program states of memory cells corresponding thereto through a sensing node to latch sensing data. The read and write circuit 130 may operate in response to page buffer control signals output from the control logic 140.

The read and write circuit 130 may sense data of a memory cell, temporarily store the read data, and output data DATA to the input/output buffer (not illustrated) of the semiconductor device 100 during a read operation. According to an embodiment, the read and write circuit 130 may include a column selection circuit in addition to the page buffers (or page registers).

The control logic 140 may be coupled to the address decoder 120, the read and write circuit 130, and the voltage generator 150. The control logic 140 may receive a command CMD and a control signal CTRL through the input/ output buffer (not illustrated) of the semiconductor device 100. The control logic 140 may be configured to control general operations of the semiconductor device 100 in response to the control signal CTRL. In addition, the control logic 140 may output a control signal to control sensing node precharge potential levels of the page buffers PB1 to PBm. The control logic 140 may control the read and write circuit 130 to perform a read operation of the memory cell array 110.

The voltage generator 150 may generate the read voltage Vread and the pass voltage Vpass in response to a control signal output from the control logic 140 during a read operation. Though not shown in FIG. 1, in addition to the read voltage Vread and the pass voltage Vpass, the voltage generator 150 may generate different voltages to perform various operations of the memory cell array 110. For example, the voltage generator 150 may generate various voltages including a program voltage, a verify voltage, and an erase voltage.

Figure 2:
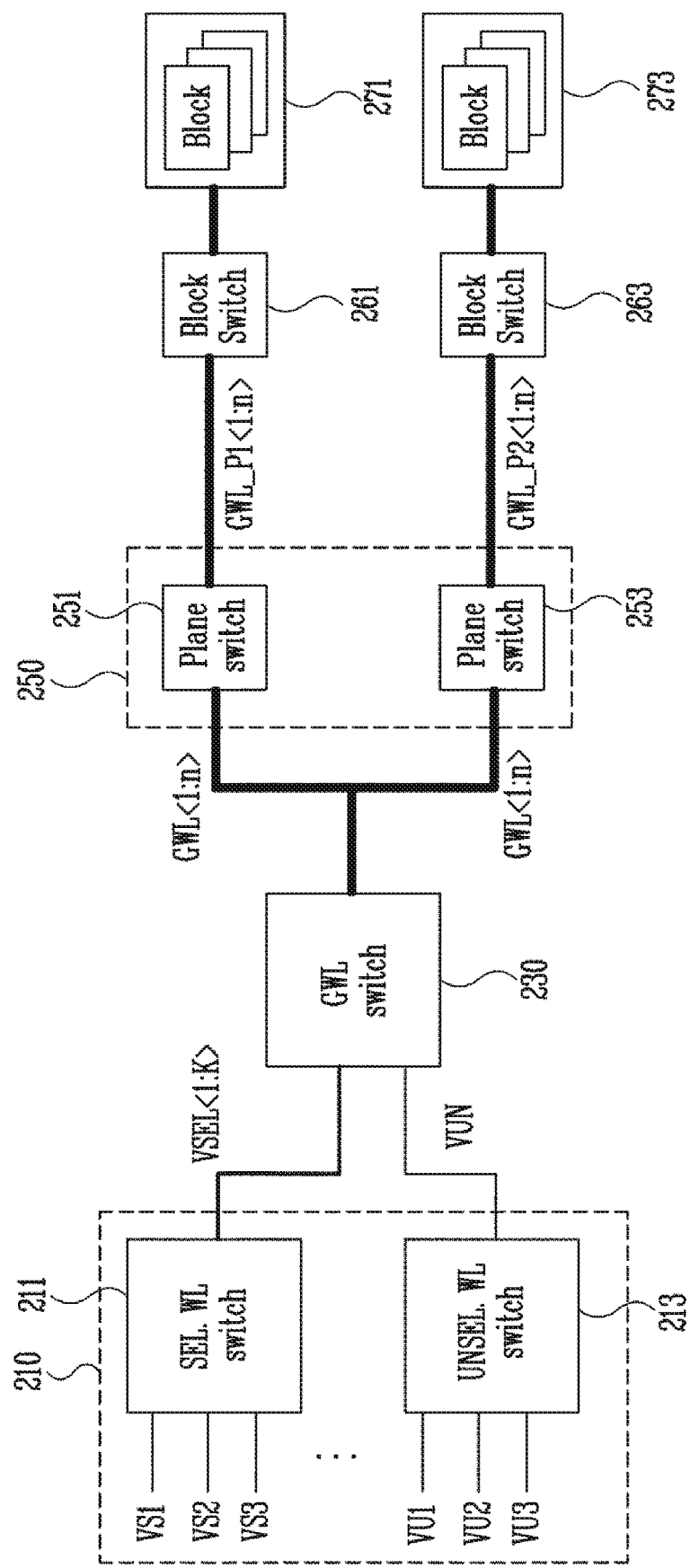
FIG. 2 is a block diagram illustrating a semiconductor device including a global word line decoder and a plurality of planes in accordance with one embodiment of the present disclosure.

FIG. 2 is a block diagram illustrating a semiconductor device including a global word line decoder and a plurality of planes.

Referring to FIG. 2, the semiconductor device may include a voltage switching unit 210, a global word line switch 230, a plane switching unit 250, a first block switch 261, a second block switch 263, a first plane 271, and a second plane 273. Referring to FIGS. 1 and 2, the voltage switching unit 210, the global word line switch 230, the plane switching unit 250, and the first and second block switches 261 and 263 of FIG. 2 may form the address decoder 120 of FIG. 1. In addition, the first and second planes 271 and 273 shown in FIG. 2 may form the memory cell array 110 shown in FIG. 1. The voltage switching unit 210, the global word line switch 230, and the plane switching unit 250 may constitute a "global word line decoder."

The voltage switching unit 210 may receive and switch a plurality of operating voltages (e.g., a program voltage VPGM, a pass voltage VPASS, a read voltage VREAD, and an erase voltage VERA) that are necessary to perform a program operation, a read operation, and a verify operation of the semiconductor device. Referring to FIG. 1, the operating voltages may be input from the voltage generator 150.

The voltage switching unit 210 may include a selected voltage switching unit 211 configured to supply selected voltages VSEL<1:K> to the global word line switch 230 and an unselected voltage switching unit 213 configured to supply an unselected voltage VUN to the global word line switch 230. The selected voltage switching unit 211 may transfer one set of the selected voltages VSEL<1:K> generated by decoding selected operating voltages VS1, VS2, VS3, . . . to the global word line switch 230 through K lines. For example, the selected operating voltages VS1, VS2, VS3, . . . may include a program voltage, a program pass voltage, and a local boosting voltage. The selected operating voltages VS1, VS2, VS3, . . . may include various other voltages.

K may be a natural number which is selected to appropriately transfer the selected operating voltages VS1, VS2, VS3, . . . . According to an embodiment, K may be 8. In an embodiment where K is 8, one set of selected voltages VSEL<1:8> formed by a combination of the selected operating voltages VS1, VS2, VS3, . . . may be transferred to the global word line switch 230 through eight lines. According to an embodiment, K may be 16. In an embodiment where K is 16, one set of selected voltages VSEL<1:16> formed by a combination of the selected operating voltages VS1, VS2, VS3, . . . may be transferred to the global word line switch 230 through sixteen lines. According to another embodiment, K may be 32 or 64.

The unselected voltage switching unit 213 may decode unselected operating voltages VU1, VU2, VU3, . . . and transfer one decoded unselected voltage VUN to the global word line switch 230. For example, the unselected operating voltages VU1, VU2, VU3, . . . may include a program pass voltage which is transferred to an unselected word line during a program operation. The unselected operating voltages VU1, VU2, VU3, . . . may also include various other voltages.

As shown in FIG. 2, one unselected voltage VUN may be transferred to the global word line switch 230. However, according to an embodiment, in the same manner as the selected voltage switching unit 211, a plurality of unselected voltages may be decoded and transferred to the global word line switch 230.

As shown in FIG. 2, the K selected voltages VSEL<1:K> and the one unselected voltage VUN may be transferred to the global word line switch through (K+1) lines.

The global word line switch 230 may selectively apply the plurality of voltages transferred from the voltage switching unit 210 to a plurality of global word lines GWL<1:n>. More specifically, the selected voltage switching unit 211 may decode and selectively apply the K selected voltages VSEL<1:K> and the one unselected voltage VUN input from the unselected voltage switching unit 213 to the plurality of global word lines GWL<1:n>.

The plane switching unit 250 may include as many plane switches as the number of the planes. As shown in FIG. 2, the memory cell array may include the two planes 271 and 273, and so the plane switching unit 250 may also include the two plane switches 251 and 253. The first plane switch 251 and the second plane switch 253 may be selectively turned on to connect the global word lines GWL<1:n> to the first and second block switches 261 and 263, respectively. For example, during an operation of the first plane 271, the first plane switch 251 may be turned on, and the second plane switch 253 may be turned off. Signals of the global word lines GWL<1:n> may be coupled to global word lines GWL_P1<1:n> coupled to the first plane 271. The first block switch 261 may couple the global word lines GWL_P1<1:n> to a local word line of the corresponding memory block in the first plane 271. In another example, during an operation of the second plane 273, the first plane switch 251 may be turned off, and the second plane switch 253 may be turned on. Signals of the global word lines GWL<1:n> may be coupled to global word lines GWL_P2<1:n> coupled to the second plane 273. The second block switch 263 may couple the global word lines GWL_P2<1:n> to a local word line of the corresponding memory block in the second plane 273. Through the above-described processes, the operating voltages from the voltage generator 150 may be decoded and transferred to the local word line of the selected memory block.

The block switches 261 and 263 may couple the global word lines GWL_P1<1:n> and GWL_P2<1:n> to local word lines coupled to corresponding memory blocks in the planes 271 and 273, respectively, on the basis of a block address. For example, during an operation of the first plane 271, the first plane switch 251 may be turned on, and the second plane switch 253 may be turned off. The first block switch 261 may couple the global word lines GWL_P1<1:n> to a local word line of the corresponding memory block in the first plane 271. In another example, during an operation of the second plane 273, the first plane switch 251 may be turned off, and the second plane switch 253 may be turned on. The second block switch 263 may couple the global word lines GWL_P2<1:n> to a local word line of the corresponding memory block in the second plane 273.

In an embodiment shown in FIG. 2, the memory cell array may include the first plane 271 and the second plane 273. However, according to various embodiments, the number of planes forming the memory cell array may vary. For example, four or more planes may form the memory cell array. Thus, the number of plane switches included in the plane switching unit 250 may change depending on various embodiments.

As described above, the voltage switching unit 210, the global word line switch 230, and the plane switching unit 250 as shown in FIG. 2 may constitute the global word line decoder. The global word line decoder may decode and transfer the operating voltages VS1, VS2, VS3, . . . and the operating voltages VU1, VU2, VU3, . . . transferred from the voltage generator 150 to the global word lines GWL_P1<1:n> or GWL_P2<1:n> coupled to a selected plane.

Figure 3:
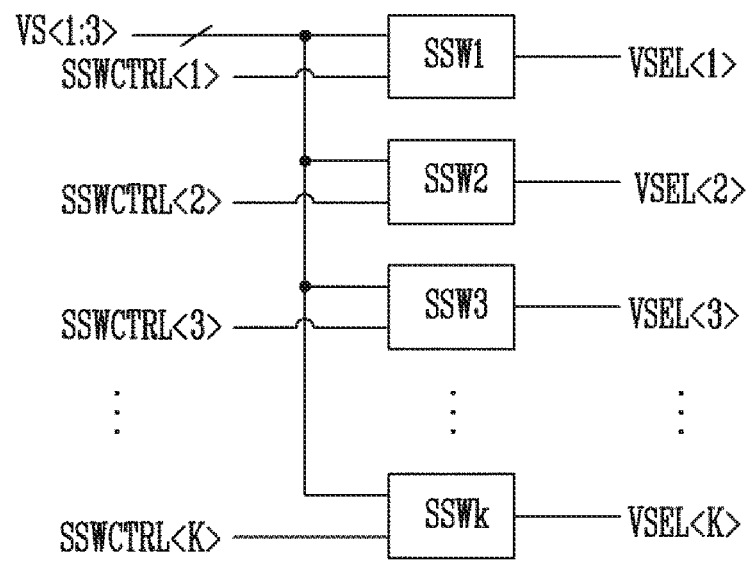
FIG. 3 is a block diagram illustrating a configuration of a selected voltage switching unit shown in FIG. 2 in accordance with one embodiment of the present disclosure.

FIG. 3 is a block diagram illustrating a configuration of the selected voltage switching unit 211 shown in FIG. 2.

Referring to FIG. 3, the selected voltage switching unit 211 may decode selected operating voltages VS<1:3> transferred from the voltage generator 150 to generate the selected voltages VSEL<1:K> transferred through K lines. The generated selected voltages VSEL<1:K> may be transferred to the global word line switch 230. For example, as shown in FIG. 3, the selected operating voltages VS<1:3> may include three voltages. In other words, the selected operating voltages VS<1:3> may be the selected operating voltages VS1, VS2, and VS3 as shown in FIG. 2. To generate the selected voltages VSEL<1:K>, the selected voltage switching unit 211 may include K voltage switches SSW1, SSW2, SSWk. Each of the voltage switches SSW1, SSW2, SSWk may receive the selected operating voltages VS<1:3>. In addition, the voltage switches SSW1, SSW2, SSWk may receive control signals SSWCTRL<1>, SSWCTRL<2>, SSWCTRL<K> corresponding thereto, respectively. The first voltage switch SSW1 may output one of the selected operating voltages VS<1:3> as a first selected voltage VSEL<1> on the basis of the first control signal SSWCTRL<1>. The second voltage switch SSW2 may output one of the selected operating voltages VS<1:3> as a second selected voltage VSEL<2> on the basis of the second control signal SSWCTRL<2>. The K-th voltage switch SSWK may output one of the selected operating voltages VS<1:3> as a K-th selected voltage VSEL<K> on the basis of the Kth control signal SSWCTRL<K>. As described above, the selected voltage switching unit 211 may combine the three selected operating voltages to generate the K selected voltages VSEL<1:K>. In other words, each of the selected voltages VSEL<1:K> may have one of the selected operating voltages VS<1:3>. As shown in FIG. 3, although the selected operating voltages VS<1:3> correspond to the three values according to one exemplary embodiment, more than three selected operating voltages may be input to the selected voltage switching unit 211 if necessary.

Figure 4A:
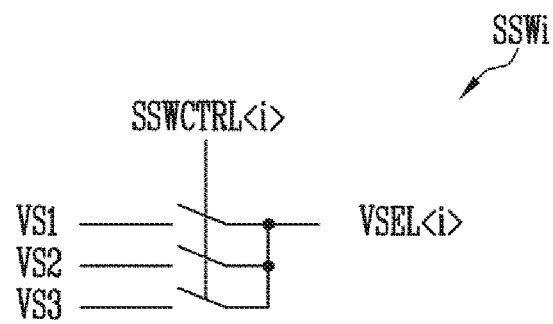
FIG. 4A is a diagram illustrating a configuration of voltage switches shown in FIG. 3 in accordance with one embodiment of the present disclosure.

FIG. 4A is a block diagram illustrating an embodiment of an i-th voltage switch SSWi shown in FIG. 3.

FIG. 4A shows an exemplary configuration of the i-th voltage switch SSWi among the K voltage switches SSW1, SSW2, SSWk included in the selected voltage switching unit 211 shown in FIG. 3. As shown in FIG. 4A, in response to an i-th control signal SSWCTRL<i>, one of the selected operating voltages VS<1:3> may be output as an i-th selection signal VSEL<i>.

Figure 4B:
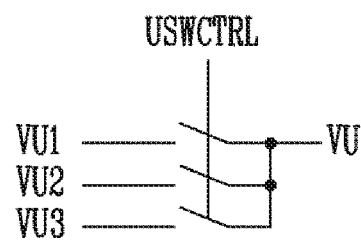
FIG. 4B is a block diagram illustrating a configuration of an unselected voltage switching unit shown in FIG. 2 in accordance with one embodiment of the present disclosure.

FIG. 4B is a block diagram illustrating an embodiment of the unselected voltage switching unit 213 shown in FIG. 2.

Referring to FIG. 4B, the unselected voltage switching unit 213 may include a single switch. The switch of the unselected voltage switching unit 213 may output one of the three unselected operating voltages VU1, VU2, and VU3 as the unselected voltage VU on the basis of a control signal USWCTRL. The unselected voltage VU may be transferred to the global word line switch 230. For example, FIG. 4B shows that the unselected operating voltages VU1, VU2, and VU3 include three voltages. However, different numbers of unselected operating voltages may be applied to the unselected voltage switching unit 213.

Figure 5:
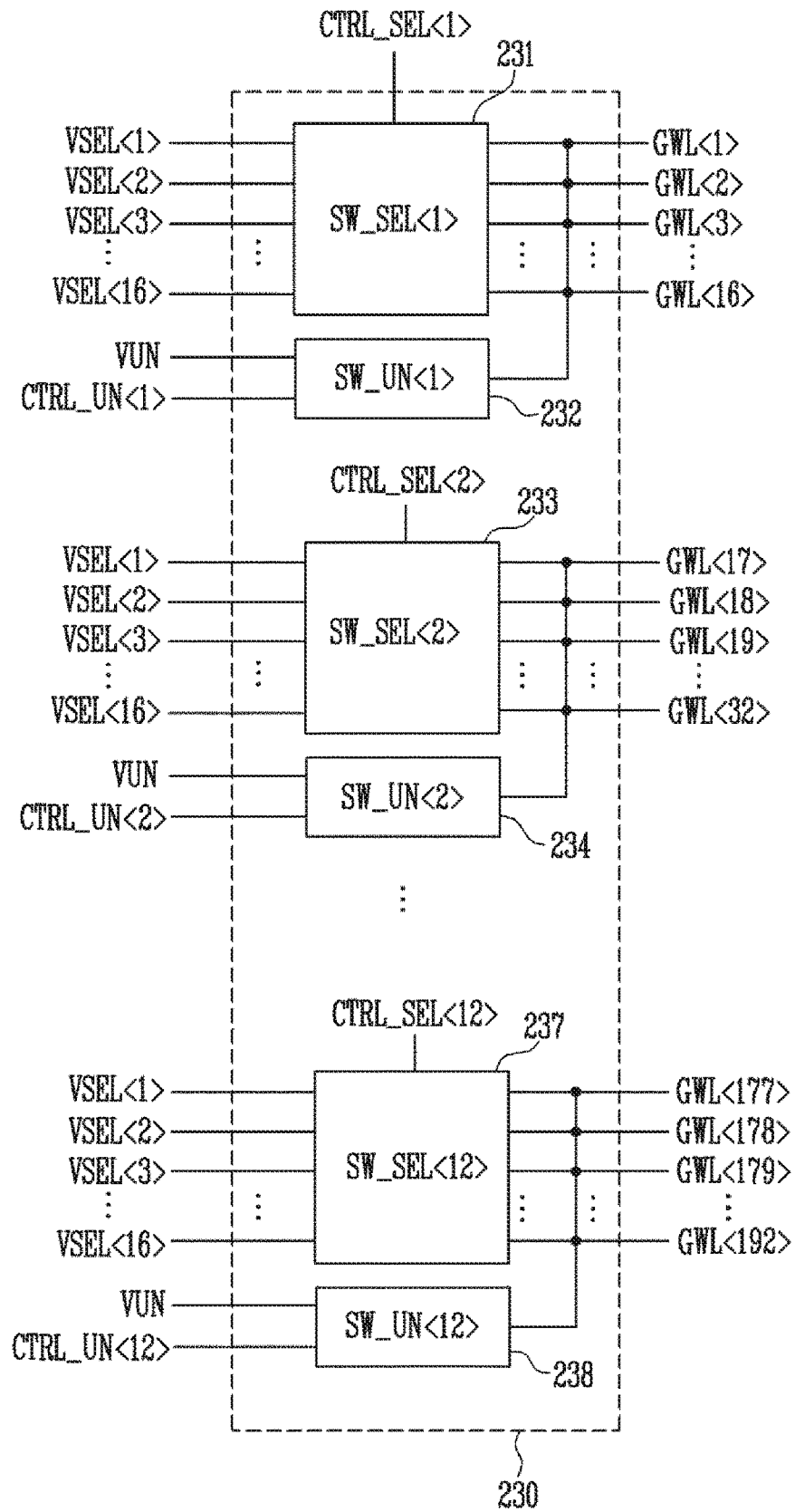
FIG. 5 is a block diagram illustrating a global word line switch shown in FIG. 2.

FIG. 5 is a block diagram illustrating a configuration of the global word line switch 230 shown in FIG. 2.

Referring to FIG. 5, the global word line switch 230 may decode and output the selected voltages VSEL<1:K> and the unselected voltage VUN to the global word lines GWL<1:n> including n lines. FIG. 5 shows an embodiment where K is 16 and n is 192. The global word line switch 230 may include twelve selected switches SW_SEL<1:12> and twelve unselected switches SW_UN<1:12> according to one exemplary embodiment. The selected switches SW_SEL<1:12> may receive control signals CTRL_SEL<1:12>, respectively, to selectively apply the selected voltages VSEL<1:K> to global word lines GWL<1:192> corresponding thereto. The unselected switches SW_UN<1:12> may receive control signals CTRL_U<1:12>, respectively, to selectively apply the unselected voltage VUN to the global word lines GWL<1:192> corresponding thereto.

Hereinafter, exemplary operations of the global word line decoder shown in FIG. 2 are described with reference to FIGS. 3 to 5. In accordance with one exemplary embodiment shown in FIG. 3, 'K' may be 16, and 'n' corresponding to the number of word lines may be 192. For example, when a program voltage is applied to a fifth word line, among local word lines of a selected block, a fifth voltage switch SSW5 of the selected voltage switching unit 211 shown in FIG. 3 may select a program voltage, among the selected operating voltages VS<1:3>, and transfer the selected program voltage as a fifth selected voltage VSEL<5>. The other voltage switches SSW1 to SSW4 and SSW6 to SSW16 may select a pass voltage, among the selected operating voltages VS<1:3>, and transfer the selected pass voltage as the first to fourth selected voltages VSEL<1:4>, and sixth to 16th selected voltages VSEL<6:16>. In addition, the unselected voltage switching unit 213 shown in FIG. 4B may select a pass voltage, among unselected operating voltages VU<1:3>, and transfer the selected pass voltage to the unselected voltage VU.

Referring to FIG. 5, the global word line switch 230 may transfer the selected voltages VSEL<1:16> and the unselected voltage VU to the global word lines GWL<1:192>. Since the program voltage is to be applied to a fifth global word line GWL<5>, the first selected switch 231 (i.e., SWL_SEL<1>) may be activated to transfer the first to 16th selected voltages VSEL<1:16> to the first to 16th global word lines GWL<1:16>. As described above, the selected switching unit as shown in FIG. may transfer the program voltage as the fifth selected voltage VSEL<5>, and the pass voltage as the first to fourth selected voltages VSEL<1:4> and the sixth to 16th selected voltages VSEL<6:16>. Therefore, when the first selected switch is activated, the program voltage may be transferred to the fifth global word line GWL<5>, and the pass voltage may be transferred to the first to fourth global word lines GWL<1:4> and the sixth to 16th global word lines GWL<6:16>. The unselected switch 232 (i.e., SW_UN<1>) may be deactivated. As a result, the unselected voltage VU may not be transferred to the first to 16th global word lines GWL<1:16>.

The pass voltage may be applied to 17th to 192nd global word lines GWL<17:192>. Therefore, the second to 12th selected switches 233, . . . , 237 (i.e., SW_SEL<2:12>) may be deactivated. Instead, the second to 12th unselected switches 234, . . . , 238 (i.e., SW_UN<2:12>) may be activated to transfer the unselected voltage VU to the 17th to 192nd global word lines GWL<17:192>. As described above, the unselected voltage switching unit 213 may transfer the pass voltage, among the unselected operating voltages VU<1:3>, as the unselected voltage VU, so that the pass voltage may be transferred to the 17th to 192nd global word lines GWL<17:192>.

In another example, when a program voltage is to be applied to a 156th word line, among local word lines of a selected block, a voltage switch SSW10 of the selected voltage switching unit 211 may transfer the program voltage as a tenth selected voltage VSEL<10>. The pass voltage may be transferred as the other selected voltages VSEL<1:9> and VSEL<11:16>. The tenth selected switch SW_SEL<10> may be activated to transfer the first to 16th selected voltages VSEL<1:16> to the 145th to 160th global word lines GWL<145:160>. The tenth unselected switch SW_UN<10> may be deactivated. In addition, the first to ninth selected switches SW_SEL<1:9> and the 11th to 12th selected switches SW_SEL<11:12> may be deactivated, and the first to ninth unselected switches SW_UN<1:9> and the 11th to 12th unselected switches SW_UN<11:12> may be activated, so that the pass voltage may be transferred to the first to 144th global word lines GWL<1:144> and the 161st to 192nd global word lines GWL<161:192>.

However, in the above-described configuration according to one embodiment, local self-boosting options may not be available. For local self-boosting, a self-boosting voltage may be applied to word lines adjacent to a word line to which a program voltage is applied. For example, when the program voltage is applied to the 16th global word line, the self-boosting voltage may be applied to the 15th and 17th global word lines. However, in a configuration as shown in FIG. 5, this self-boosting option is not available.

When the global word line decoder is configured as shown in FIGS. 2 to 5, the chip area where the semiconductor device 100 is formed may increase when the number of switches and the number of lines increase. The total number of lines and their area may increase since the plurality of global word lines GWL<1:n> exist between the global word line switch 230 and the plane switching unit 250 and since the plurality of global word lines GWL_P1<1:n> and GWL_P2<1:n> exist between the plane switching unit 250 and the block switches 261 and 263. Therefore, a global word line decoder performing the same operations with the reduced numbers of switches and lines may be more beneficial. The area of the plurality of global word lines GWL<1:n> formed between the global word line switch 230 and the plane switching unit 250 may need to be reduced.

Figure 6:
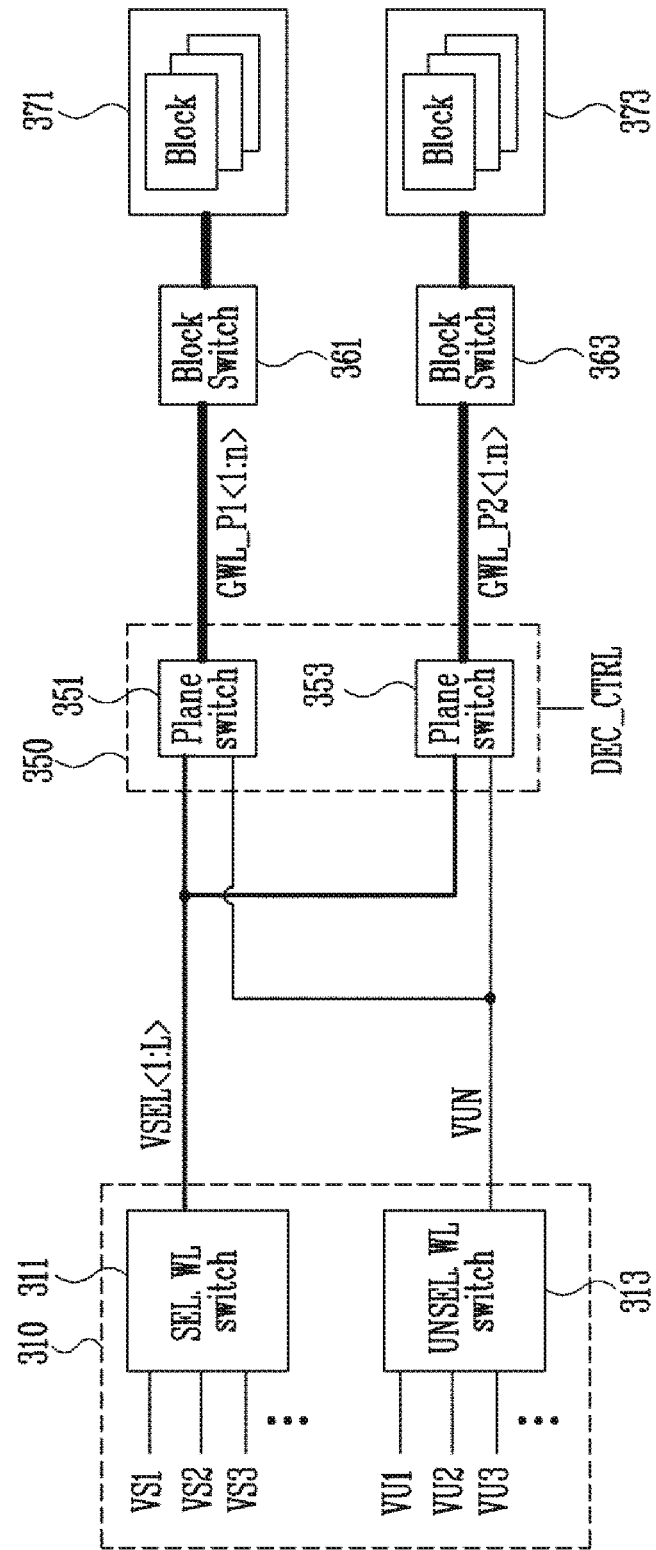
FIG. 6 is a block diagram illustrating a global word line decoder and a semiconductor device including the same according to an embodiment of the invention.

FIG. 6 is a block diagram illustrating a global word line decoder and a semiconductor device including the same according to an embodiment of the invention.

Referring to FIG. 6, a global word line decoder according to an embodiment of the invention may include a voltage switching unit 310 and a plane switching unit 350. In addition, a semiconductor device according to an embodiment of the invention may include the global word line decoder, block switches 361 and 363, and planes 371 and 373. Referring to FIGS. 1 and 6, the voltage switching unit 310, the plane switching unit 350, and first and second block switches 361 and 363 as shown in FIG. 6 may form the address decoder 120 shown in FIG. 1. In addition, the first and second planes 371 and 373 shown in FIG. 6 may form the memory cell array 110 shown in FIG. 1. As described above, the voltage switching unit 310 and the plane switching unit 350 may constitute the "global word line decoder". The global word line decoder in FIG. 6 may be different from the global word line decoder shown in FIG. 2 since it does not include the global word line switch 230.

In other words, as shown in FIG. 6, selected voltages VSEL<1:L> and the unselected voltage VUN output from the voltage switching unit 310 may be directly transferred to the plane switching unit 350, and the plane switching unit 350 may decode and transfer the selected voltages VSEL<1:L> and the unselected voltage VUN to the global word lines GWL_P1<1:n> and GWL_P2<1:n>, respectively. Therefore, in comparison with the global word line decoder shown in FIG. 2, the switches of the global word line switch 230 may be removed from the global word line decoder shown in FIG. 6. However, the number of the switches of the plane switching unit 350 may increase. In addition, the plurality of global word lines GWL<1:n> may be formed between the global word line switch 230 and the plane switching unit 250 of the global word line decoder according to one embodiment shown in FIG. 2. Instead, the plurality of global word lines GWL<1:n> may not be formed between the voltage switching unit 310 and the plane switching unit 350 of the global word line decoder, and the relatively small number of transmission lines for the selected voltages VSEL<1:L> and the unselected voltage VUN may be formed therebetween according to one embodiment shown in FIG. 6. Therefore, the global word line decoder shown in FIG. 6 may have reduced numbers of switches and lines, so that the chip area may be reduced and manufacturing costs may be reduced.

The voltage switching unit 310 may include a selected voltage switching unit 311 configured to supply the selected voltages VSEL<1:L> to the plane switching unit 350 and an unselected voltage switching unit 313 configured to supply the unselected voltage VUN to the plane switching unit 350. The selected voltage switching unit 311 may decode selected operating voltages VS1, VS2, VS3, . . . and transfer one set of the selected voltages VSEL<1:L> to the plane switching unit 350 through L lines. For example, the selected operating voltages VS1, VS2, VS3, . . . may include a program voltage, a program pass voltage, and a local boosting voltage. The selected operating voltages VS1, VS2, VS3, may include various other voltages.

Here, L may be a natural number which is selected to appropriately transfer the selected operating voltages VS1, VS2, VS3, . . . . According to an embodiment, L may be 8. In an embodiment in which L is 8, one set of selected voltages VSEL<1:8> formed by combining the selected operating voltages VS1, VS2, VS3, . . . may be transferred to the plane switching unit 350 through eight lines. According to another embodiment, L may be 16. In an embodiment in which L is 16, one set of selected voltages VSEL<1:16> from the selected operating voltages VS1, VS2, VS3, . . . may be transferred to the plane switching unit 350 through sixteen lines. According to an embodiment, L may be 32. In an embodiment in which L is 32, one set of selected voltages VSEL<1:32> from the selected operating voltages VS1, VS2, VS3, . . . may be transferred to the plane switching unit 350 through thirty-two lines.

The plane switching unit 350 may include as many plane switches as the number of planes. As shown in FIG. 6, a memory cell array may include the two planes 371 and 373, and the plane switching unit 350 may also include the two plane switches 351 and 353. The first plane switch 351 and the second plane switch 353 may be selectively turned on, and the turned-on plane switch may decode and output the selected voltages VSEL<1:L> and the unselected voltage VUN to the corresponding global word lines GWL_P1<1:n> or GWL_P2<1:n>.

For example, when during an operation of the first plane 371, the first plane switch 351 may be turned on, and the second plane switch 353 is turned off, so that the first plane switch 351 may decode and output the selected voltages VSEL<1:L> and the unselected voltage VUN to the global word lines GWL_P1<1:n>. The global word lines GWL_P1<1:n> may be coupled to the first block switch 361, and the first block switch 361 may couple the global word lines GWL_P1<1:n> to a local word line of the corresponding memory block in the first plane 371. In another example, when during an operation of the second plane 373, the first plane switch 351 is turned off, and the second plane switch 353 is turned on, so that the first plane switch 353 may decode and output the selected voltages VSEL<1:L> and the unselected voltage VUN to the global word lines GWL_P2<1:n>. The global word lines GWL_P2<1:n> may be coupled to the second block switch 363, and the second block switch 363 may couple the global word lines GWL_P2<1:n> to a local word line of the corresponding memory block in the second plane 373.

In an embodiment shown in FIG. 6, the memory cell array may include the first plane 371 and the second plane 373. However, according to one or more embodiments of the disclosure, the number of planes forming the memory cell array may vary. For example, four or more planes may form the memory cell array. Thus, the number of plane switches included in the plane switching unit 350 may change according to various embodiments.

The selected voltages VSEL<1:L> output from the selected voltage switching unit 311 may include a first pre-decoded voltage and a second pre-decoded voltage. The plane switching unit 350 may swap the order and output the first pre-decoded voltage and the second pre-decoded voltage. Therefore, a self-boosting voltage may be efficiently transferred during a program using local self-boosting. Exemplary operations of the selected voltage switching unit 311 and the plane switching unit 350 are described in detail with reference to FIG. 7 to FIGS. 12A to 12F.

Figure 7:
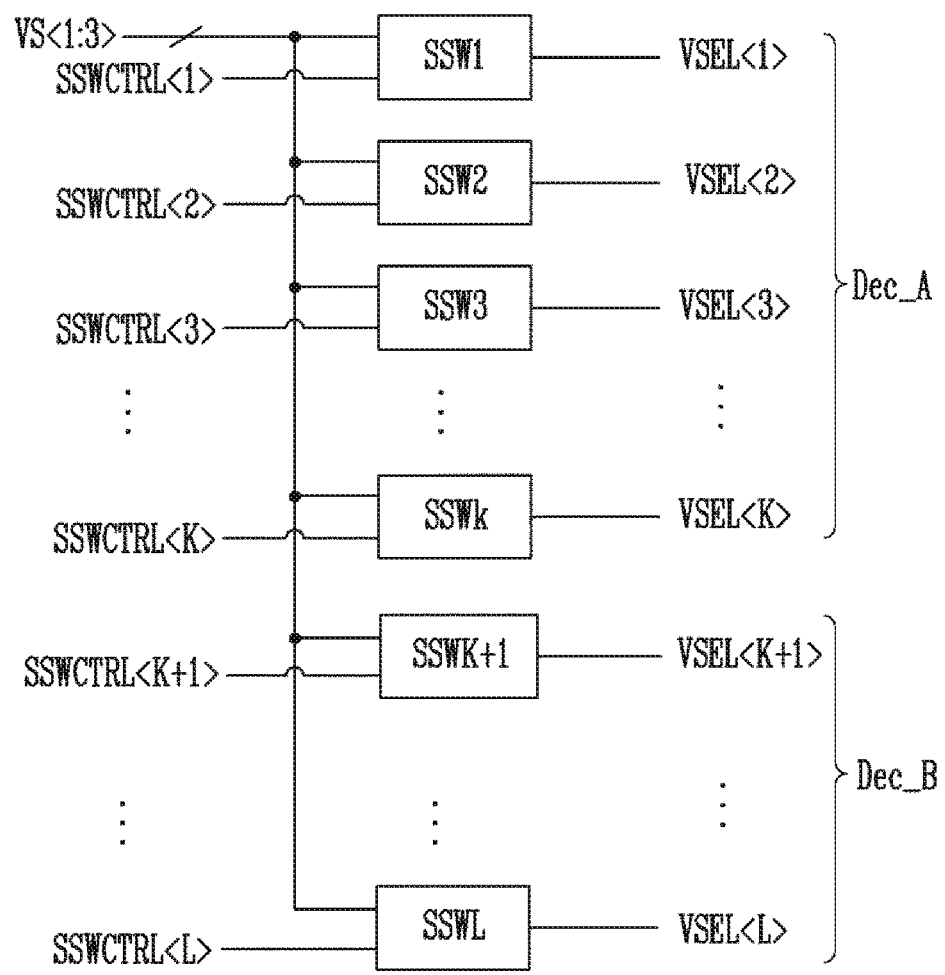
FIG. 7 is a block diagram illustrating a configuration of a selected voltage switching unit shown in FIG. 6.

FIG. 7 is a block diagram illustrating a configuration of the selected voltage switching unit 311 shown in FIG. 6.

Referring to FIG. 7, the selected voltage switching unit 311 may decode the selected operating voltages VS<1:3> transferred from the voltage generator 150 to generate the selected voltages VSEL<1:L> transferred through the L lines. The generated selected voltages VSEL<1:L> may be transferred to the plane switching unit 350. For example, as shown in FIG. 7, the selected operating voltages VS<1:3> may include three voltages. In other words, the selected operating voltages VS<1:3> may be the selected operating voltages VS1, VS2, and VS3 as shown in FIG. 6. To generate the selected voltages VSEL<1:L>, the selected voltage switching unit 311 may include L voltage switches SSW1, SSW2, SSWL. Each of the voltage switches SSW1, SSW2, SSWL may include the selected operating voltages VS<1:3>. In addition, the voltage switches SSW1, SSW2, SSWL may receive control signals SSWCTRL<1>, SSWCTRL<2>, SSWCTRL<L> corresponding thereto, respectively. The first voltage switch SSW1 may output one of the selected operating voltages VS<1:3> as the first selected voltage VSEL<1> on the basis of the first control signal SSWCTRL<1>. The second voltage switch SSW2 may output one of the selected operating voltages VS<1:3> as the second selected voltage VSEL<2> on the basis of the second control signal SSWCTRL<2>. In this manner, the L-th voltage switch SSWL may output one of the selected operating voltages VS<1:3> as an L-th selected voltage VSEL<L> on the basis of the L-th control signal SSWCTRL<L>. As described above, the selected voltage switching unit 311 may combine three selected operating voltages to generate the L selected voltages VSEL<1:L>. In other words, each of the selected voltages VSEL<1:L> may have one of the selected operating voltages VS<1:3>. As shown in FIG. 7, although the selected operating voltages VS<1:3> are three voltages, more than three selected operating voltages may be input to the selected voltage switching unit 311 if necessary according to various embodiments of the disclosure.

The selected voltages VSEL<1:L> may include a first pre-decoded voltage Dec_A and a second pre-decoded voltage Dec_B. More specifically, the first pre-decoded voltage Dec_A may correspond to the selected voltages VSEL<1:K>, and the second pre-decoded voltage Dec_B may correspond to the selected voltages VSEL<K+1:L>. For example, K may correspond to the half of the L value. For example, when L is 32, K may be 16. The total of the thirty-two selected voltages VSEL<1:32> may be divided into the first pre-decoded voltage Dec_A including sixteen selected voltages VSEL<1:16> and the second pre-decoded voltage Dec_B including sixteen selected voltages VSEL<17:32>. An exemplary global word line decoding method using the first pre-decoded voltage Dec_A and the second pre-decoded voltage Dec_B is described with reference to FIGS. 12A and 12B.

Figure 8:
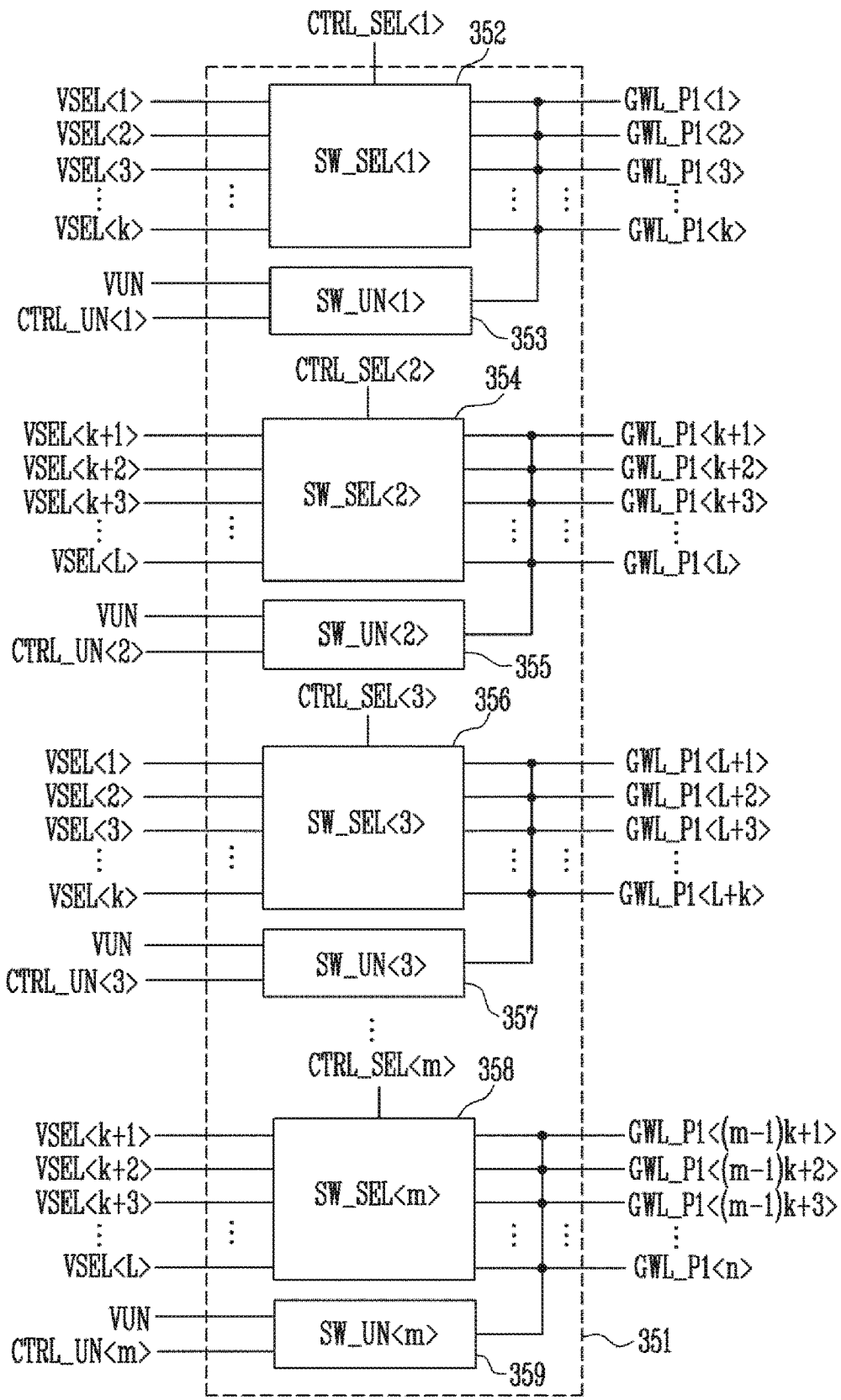
FIG. 8 is a block diagram illustrating a configuration of a first plane switch shown in FIG. 6.

FIG. 8 is a block diagram illustrating a configuration of the first plane switch 351 shown in FIG. 6. The configuration of the first plane switch 351 may be applied to the second plane switch 353 shown in FIG. 6, and thus overlapping descriptions will be omitted.

Referring to FIG. 8, the global word line switch 351 may decode and output the selected voltages VSEL<1:L> and the unselected voltage VUN to the global word lines GWL_P1<1:n> consisting of lines. The first plane switch 351 may include m selected switches SW_SEL<1:m> and m unselected switches SW_UN<1:m>. In FIG. 8, K may be a number corresponding to the half of the L value. In another embodiment, K may be a number that is greater or less than the half of the L value. In addition, m, L, and n may satisfy the following Equation 1:

$$(L \times m) \div 2 = n \qquad \text{[Equation 1]}$$

As shown in FIG. 8, the first to K-th selected voltages VSEL<1:K> of the selected voltages VSEL<1:L> may be coupled to odd-numbered selected switches SW_SEL<1>, SW_SEL<3>, SW_SEL<5>, . . . . In other words, the first pre-decoded voltage Dec_A may be coupled to the odd-numbered selected switches. In addition, (K+1)-th to L-th selected voltages VSEL<K+1:L> of the selected voltages VSEL<1:L> may be coupled to even-numbered selected switches SW_SEL<2>, SW_SEL<4>, SW_SEL<6>, . . . . In other words, the second pre-decoded voltage Dec_B may be coupled to even-numbered selected switches. The unselected voltage VUN may be coupled to all unselected switches SW_UN<1:m>. In response to control of selected control signals CTRL<1:m> and unselected control signals CTRL_UN<1:m>, the selected voltages VSEL<1:L> and the unselected voltage VUN may be transferred to the global word lines GWL_P1<1:n>. Hereinafter, an exemplary embodiment in which specific numbers apply to K, L, m, and n is described with reference to FIG. 9.

Figure 9:
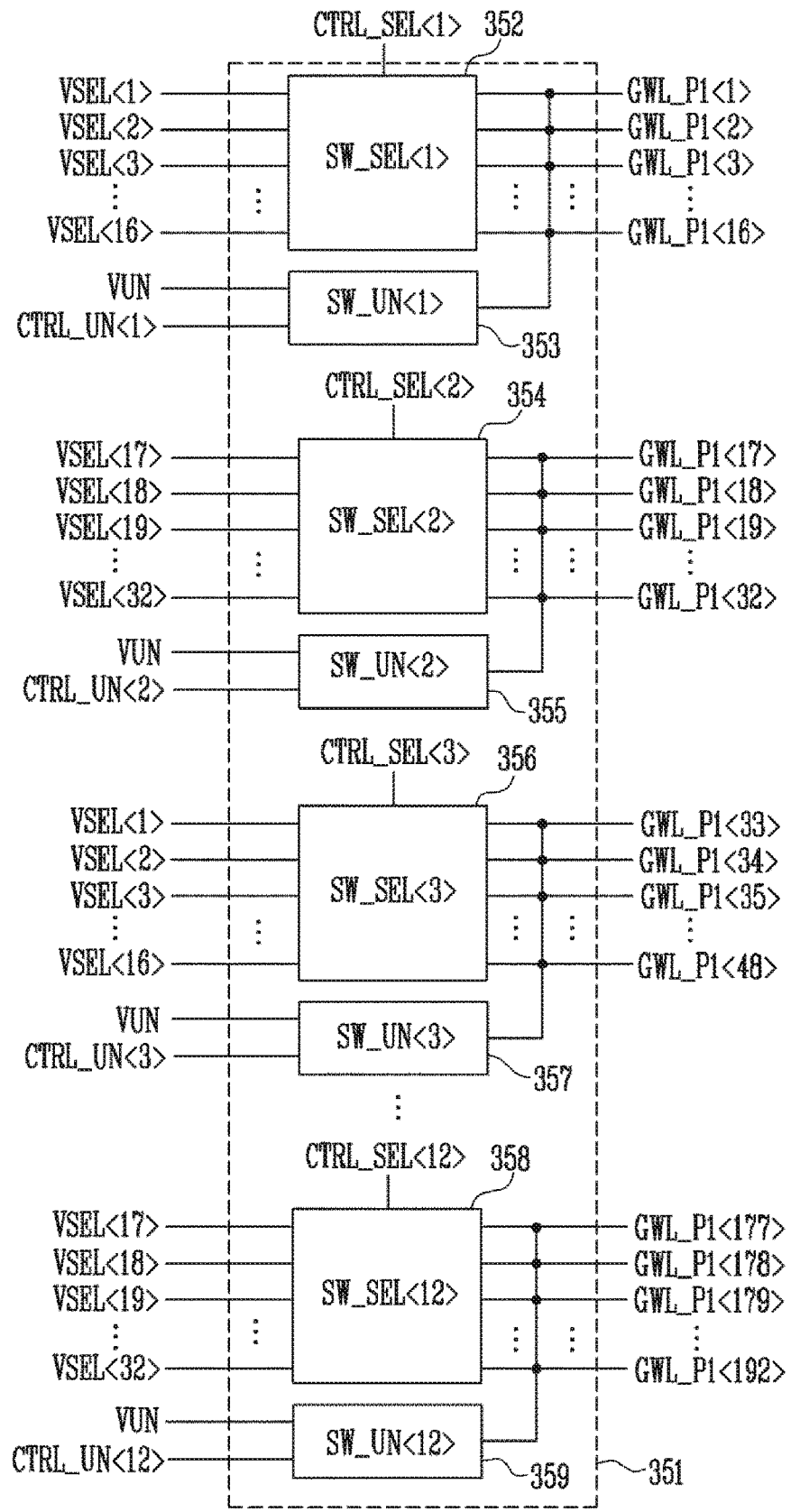
FIG. 9 is a block diagram illustrating a configuration of a first plane switch shown in FIG. 8.

FIG. 9 is a block diagram illustrating an embodiment of the first plane switch 351 shown in FIG. 8. The first plane switch 351 shown in FIG. 9 may have the same configuration as the first plane switch 351 shown in FIG. 8, and by way of example, specific numbers may be displayed for K, L, m, and n. In other words, in the embodiment shown in FIG. 9, K may be 16, L may be 32, m may be 12, and n may be 192.

Therefore, the first plane switch 351 may decode and output the selected voltages VSEL<1:32> and the unselected voltage VUN to global word lines GWL_P1<1:192> having 192 lines. The global word line switch 351 may include twelve selected switches SW_SEL<1:12> and twelve unselected switches SW_UN<1:12>. First to 16th selected voltages VSEL<1:16> of the selected voltages VSEL<1:32> may be coupled to the odd-numbered selected switches SW_SEL<1>, SW_SEL<3>, SW_SEL<5>, SW_SEL<11>. In addition, 17th to 32nd selected voltages VSEL<17:32> of the selected voltages VSEL<1:32> may be coupled to the even-numbered selected switches SW_SEL<2>, SW_SEL<4>, SW_SEL<6>, SW_SEL<12>. The unselected voltage VUN may be coupled to all unselected switches SW_UN<1:12>. In response to control of selected control signals CTRL<1:12> and unselected control signals CTRL_UN<1:12>, the selected voltages VSEL<1:32> and the unselected voltage VUN may be transferred to the global word lines GWL_P1<1:192>.

As shown in FIG. 7, the first to K-th selected voltages VSEL<1:K> may be applied as the first pre-decoded voltage Dec_A, and the (K+1)-th to L-th selected voltages VSEL<K+1:L> may be applied as the second pre-decoded voltage Dec_B. The first plane switch 351 may swap the order of the first pre-decoded voltage and the second pre-decoded voltage depending on the position of a selected word line. An exemplary decoding operation of the first plane switch 351 will be described below in detail with reference to FIGS. 12A to 12F.

Figure 10:
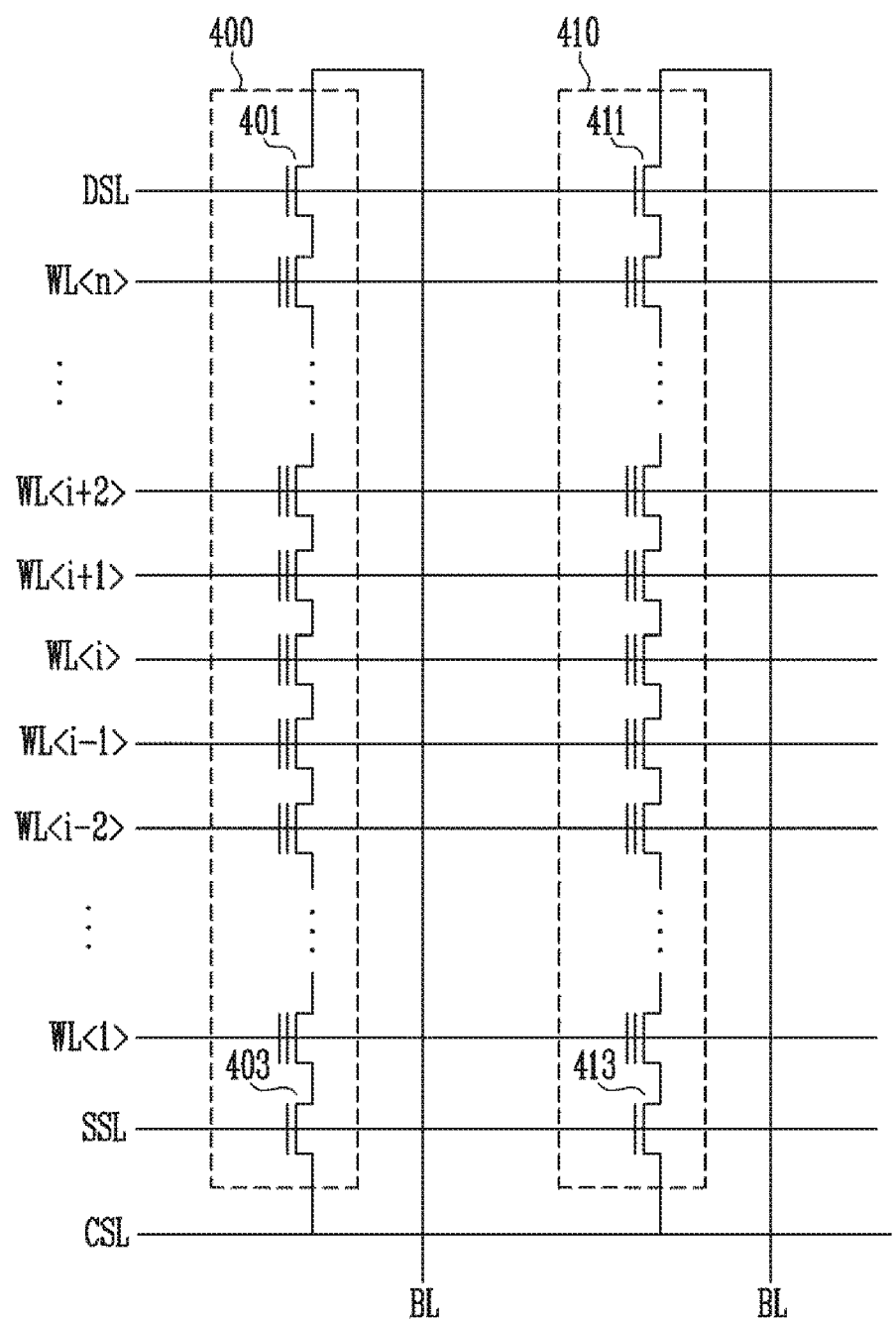
FIG. 10 is a circuit diagram illustrating a portion of a memory cell array shown in FIG. 1.

FIG. 10 is a circuit diagram illustrating a portion of the memory cell array shown in FIG. 1.

Referring to FIG. 10, the memory cell array may include a plurality of cell strings 400, 410, . . . , and each of the cell strings 400 and 410 may include a plurality of memory cells coupled in series between drain selection transistors 401 and 411 and source selection transistors 403 and 413. The drain selection transistors 401 and 411 and the source selection transistors 403 and 413 may be coupled to a drain selection line DSL and a source selection line SSL, respectively, and the memory cells therebetween may be coupled through respective word lines WL<1> to WL<n>. Each of the cell strings 400 and 410 may be selectively coupled to a bit line BL through each of the drain selection transistors 401 and 411 and selectively coupled to a common source line CSL coupled to a ground voltage terminal through each of the source selection transistors 403 and 413. The plurality of cell strings 400, 410, . . . coupled to respective bit lines BL may be coupled in parallel with the common source line CSL and form a single memory cell block.

In order to perform a program operation, a read operation, and an erase operation of the semiconductor device, a bias voltage suitable for each operation may be applied to a selected word line. For example, a program voltage may be applied to a word line selected by a row address input during a program operation, and a pass voltage of e.g., 10V or less may be applied to the other word lines. However, as technological advancements have resulted in higher capacity and integration density of a memory device, in order to avoid an interference phenomenon (disturbance) of a neighboring word line or a bit line (or a memory cell connected thereto), a pass voltage having different levels may be applied to word lines within a predetermined distance from a selected word line during a program operation. This is called a boosting option.

Figure 11:
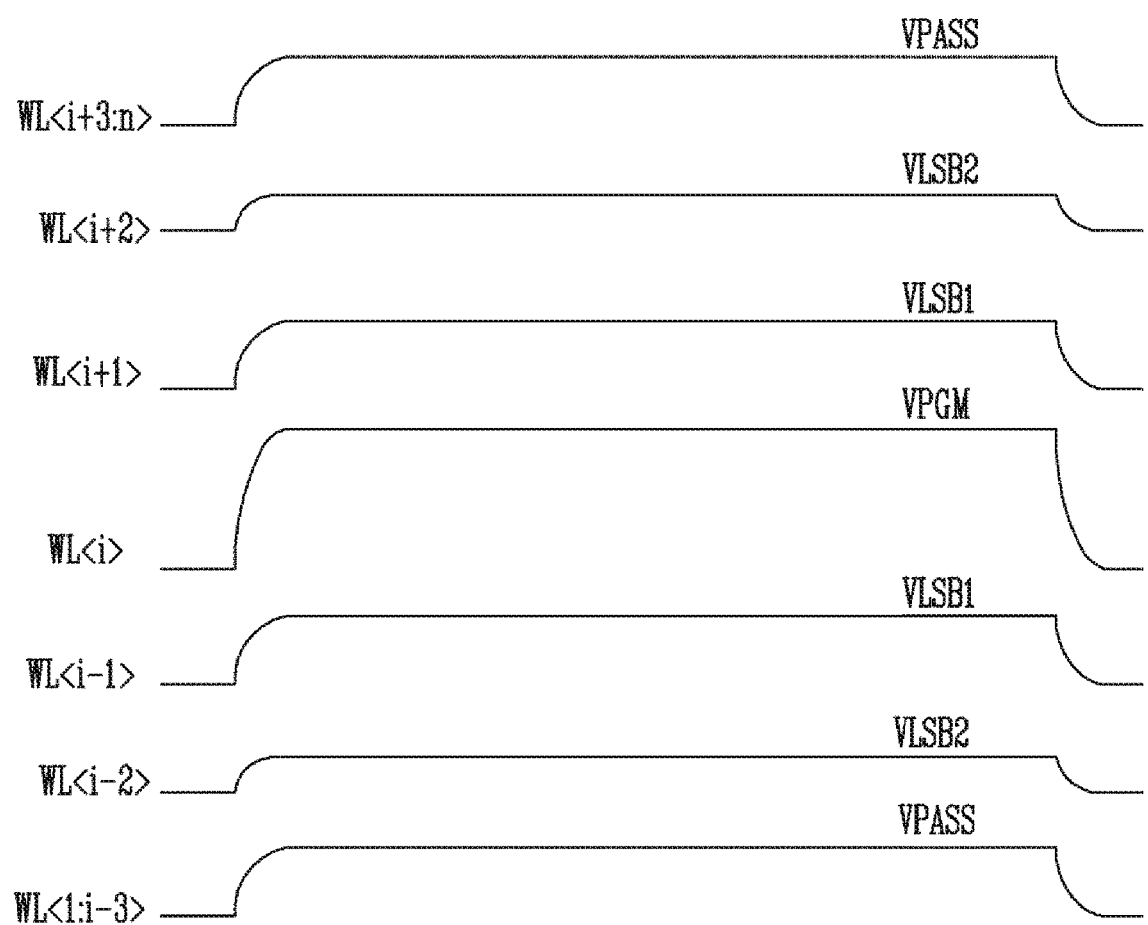
FIG. 11 is a timing diagram illustrating voltages applied to a word line shown in FIG. 10 during a program operation.

FIG. 11 is a timing diagram illustrating voltages applied to word lines of FIG. 10 during a program operation. As shown in FIG. 11, it is assumed that an i-th word line WL<i> is selected by a row address which is input during a program operation. The program voltage VPGM may be applied to the selected word line WL<i>, and the above-described boosting option may be applied to word lines WL<i−2> to WL<i−1> and WL<i+1> to WL<i+2> which are located within a predetermined distance from the selected word line WL<i>, so that different voltages VLSB1 and VLSB2 may be applied thereto according to the distance from the word line WL<i>. On the other hand, the same pass voltage VPASS may be applied to the other word lines WL<1> to WL<i−3> and WL<i+3> to WL<n>.

FIGS. 12A to 12F are tables illustrating operations of the global word line decoder shown in FIG. 6.

Referring to FIG. 12A, a decoding operation when a first global word line GWL_P1<1> is selected for the first plane 371 is selected is shown according to one exemplary embodiment. More specifically, FIG. 12A shows a decoding operation of a global word line to perform a program operation on a first local word line coupled to a selected memory block, among memory blocks included in the first plane 371.

To apply a program voltage to the first local word line, among local word lines of the selected memory block, the program voltage VPGM may be applied to the first global word line GWL_P1<1> of the global word lines GWL_P1<1:n>. A local self-boosting option may be applied to the second and third global word lines GWL_P1<2> and GWL_P1<3> adjacent to the selected first global word line GWL_P1<1>. Therefore, a first local self-boosting voltage VLSB1 and a second local self-boosting voltage VLSB2 may be applied to the second and third global word lines GWL_P1<2> and GWL_P1<3>, respectively.

The pass voltage VPASS may be applied to the remaining global word lines GWL_P1<4> to GWL_P1<192>. FIG. 12A shows a decoding result of the global word line in the above-described exemplary operation.

To perform the decoding operation shown in FIG. 12A, the selected voltage switching unit 311 shown in FIG. 7 may decode and output the selected voltages VSEL<1:32>. More specifically, the first switch SSW1 may output the program voltage VPGM as the first selected voltage VSEL<1>. The second switch SSW2 may output the first local self-boosting voltage VLSB1 as the second selected voltage VSEL<2>. The third switch SSW3 may output the second local self-boosting voltage VLSB2 as the third selected voltage VSEL<3>. The fourth to 32nd switches SSW4 to SSW32 may output the pass voltage VPASS as the fourth to 32nd selected voltages VSEL<4> to VSEL<32>. As described above, the first to 16th selected voltages VSEL<1:16> may be the first pre-decoded voltage Dec_A, and the 17th to 32nd selected voltage VSEL<17:32> may be the second pre-decoded voltage Dec_B. In addition, the unselected voltage switching unit 213 shown in FIG. 4B may output the pass voltage VPASS as the unselected voltage VU.

To perform the decoding operation shown in FIG. 12A, the first selected switch 352 (i.e., SW_SEL<1>) shown in FIG. 9 may be activated on the basis of the control signal CTRL_SEL<1>, and the first unselected switch SW_UN<1> may be activated on the basis of the control signal CTRL_UN<1>. Therefore, the first pre-decoded voltage Dec_A (i.e., VSEL<1:16>), among selected voltages SEL<1:32>, may be applied to the first to 16th global word lines GWL_P1<1:16>. In addition, the second selected switch 354 (i.e., SW_SEL<2>) as shown in FIG. 9 may be activated on the basis of the control signal CTRL_SEL<2>, and the second unselected switch 355 (i.e., SW_UN<2>) may be deactivated on the basis of the control signal CTRL_UN<2>. Therefore, the second pre-decoded voltage Dec_B (i.e., VSEL<17:32>) may be output to the 17th to 32th global word lines GWL_P1<17:32>, among the selected voltages VSEL<1:32>. Therefore, the program voltage VPGM may be output to the first global word line GWL_P1<1>, a first local self-boosting voltage VSLB1 may be output to the second global word line GWL_P1<2>, and the second local self-boosting voltage VLSB2 may be output to the third global word line GWL_P1<3>. The pass voltage VPASS may be output to the fourth to 32nd global word lines GWL_P1<4:32>.

The third to 12th selected switch 356, . . . , 358 (i.e., SW_SEL<3:12>) shown in FIG. 9 may be deactivated on the basis of the control signals CTRL_SEL<3:12>, and the third to 12th unselected switches 357, 359 (i.e., SW_UN<3:12>) may be activated on the basis of the control signals CTRL_UN<3:12>. Therefore, the pass voltage VPASS which is the unselected voltage VU may be output to the 33rd to 192nd global word lines GWL_P1<33:192>.

Although it is not shown in FIG. 12A, when a program operation is performed on the second local word line after the program operation of the first local word line, the program voltage VPGM may be applied to the second global word line GWL_P1<2> among the global word lines GWL_P1<1:n>. A local self-boosting option may be applied to the first, third, and fourth global word lines GWL_P1<1>, GWL_P1<3>, GWL_P1<4> adjacent to the selected second global word line GWL_P1<2>. Therefore, the local self-boosting voltage VLSB1 may be applied to the first and third global word lines GWL_P1<1> and GWL_P1<3>, and the second local self-boosting voltage VLSB2 may be applied to the fourth global word line GWL_P1<4>. The first switch SSW1 included in the selected voltage switching unit 311 as shown in FIG. 7 may output the first local self-boosting voltage VLSB1 as the first selected voltage VSEL<1>. More specifically, the second switch SSW2 may output the program voltage VPGM as the second selected voltage VSEL<2>. The third switch SSW3 may output the first local self-boosting voltage VLSB1 as the third selected voltage VSEL<3>. The fourth switch SSW4 may output the second local self-boosting voltage VLSB2 as the fourth selected voltage VSEL<4>. The fifth to 32nd switches SSW5 to SSW32 may output the pass voltage VPASS as fifth to 32nd selected voltages VSEL<5> to VSEL<32>. The first to 12th selected switches SW_SEL<1:12> and the first to 12th unselected switches SW_UN<1:12> as shown in FIG. 9 may perform an operation in the same manner as the decoding operation during the program operation on the first local word line as described with reference to FIG. 12A. In other words, the first and second selected switches SW_SEL<1:2> may directly output the first to 32nd selected voltages VSEL<1> to VSEL<32> to the first to 32nd global word lines GWL_P1<1> to GWL_P1<32>. The third to 12th unselected switches SW_UN<3:12> may output the pass voltage VPASS which is the unselected voltage VUN to the 33rd to 192nd global word lines GWL_P1<33> to GWL_P1<192>.

When a program operation of the first to 30th local word lines is performed in the same manner as described above, only the decoding operation of the selected voltage switching unit 311 as shown in FIG. 7 may be changed, whereas the decoding operation of the first plane switch 351 as shown in FIG. 9 may remain the same. For convenience of explanation, the selected voltages including the program voltage VPGM, the first local self-boosting voltage VLSB1, and the second local self-boosting voltage VLSB2 may be referred to as a "selected voltage window." In addition, the selected voltages corresponding to the first pre-decoded voltage Dec_A may be referred to as a "first pre-decoding window." In addition, the selected voltages corresponding to the second pre-decoded voltage Dec_B may be referred to as a "second pre-decoding window." When a selected position of a global word line changes, the selected voltage window may also move. For example, the selected voltage window shown in FIG. 12A may correspond to the first to third selected voltages VSEL<1:3>. When a program operation is performed on the seventh local word line, the program voltage VPGM may be supplied to the seventh global word line GWL_P1<7>, the first local self-boosting voltage VLSB1 may be supplied to the sixth and eighth global word lines GWL_P1<6> and GWL_P1<8>, and the second local self-boosting voltage VLSB2 may be supplied to the fifth and ninth global word lines GWL_P1<5> and GWL_P1<9>. Therefore, the selected voltage window may correspond to the fifth to ninth selected voltages VSEL<5:9>.

Even when the selected position of the global word line is changed, the first pre-decoding window and the second pre-decoding window may not move. In other words, in the above-described embodiment, the first pre-decoding window may correspond to the first to 16th selected voltages VSEL<1:16>, and the second pre-decoding window may correspond to the 17th to 32nd selected voltages VSEL<17:32>.

According to one or more exemplary embodiments of the present invention, the plane switches of the global word line decoder may be configured to swap the order and output the first pre-decoded voltage and the second pre-decoded voltage when the selected voltage window is adjacent to an "edge" of the first pre-decoding window or the second pre-decoding window. The case in which the selected voltage window is adjacent to an edge of the first pre-decoding window or the second pre-decoding window will be described with reference to FIG. 12B.

Referring to FIG. 12B, to perform a program operation on the 30th local word line, the program voltage VPGM may be applied to the 30th global word line GWL_P1<30> among the global word lines GWL_P1<1:n>. The first local self-boosting voltage VLSB1 may be applied to the 29th and 31st global word lines GWL_P1<29> and GWL_P1<31> adjacent to the selected 30th global word line GWL_P1<30>, and the second local self-boosting voltage VLSB2 may be applied to the 28th and 32nd global word lines GWL_P1<28> and GWL_P1<32>. The 30th switch SSW30 included in the selected voltage switching unit 311 as shown in FIG. 7 may output the program voltage VPGM as the 30th selected voltage VSEL<30>. In addition, the 29th and 31st switches SSW29 and SSW31 may output the first local self-boosting voltage VLSB1 as the 29th and 31st selected voltages VSEL<29> and VSEL<31>, respectively. In addition, the 28th and 32nd switches SSW28 and SSW32 may output the second local self-boosting voltage VLSB2 as the 28th and 32nd selected voltages VSEL<28> and VSEL<32>, respectively. The first to 27th switches SSW1 to SSW27 may output the pass voltage VPASS as the first to 27th selected voltages VSEL<1:27>, respectively. The first and second selected switches SW_SEL<1:2> shown in FIG. 9 may directly output the first to 32nd selected voltages VSEL<1:32> to the first to 32nd global word lines GWL_P1<1> to GWL_P1<32>. The third to 12th unselected switch SW_UN<3:12> may output the pass voltage VPASS which is the unselected voltage VUN to the 33rd to 192nd global word lines GWL_P1<33:192>.

Referring to FIG. 12B, the selected voltage window may correspond to the 28th to 32nd selected voltages VSEL<28:32>, and the second pre-decoding window may correspond to the 17th to 32nd selected voltages VSEL<17:32>. Therefore, this may correspond to the case in which the selected voltage window of FIG. 12B is adjacent to the edge of the second pre-decoding window. In this case, the first plane switch 351 may be configured to swap the order of the first pre-decoded voltage Dec_A and the second pre-decoded voltage Dec_B and output them. Referring to FIG. 12B, a decoding operation may be performed so that the first pre-decoded voltage Dec_A is followed by the second pre-decoded voltage Dec_B. However, referring to FIG. 12C, a decoding operation may be performed so that the first pre-decoded voltage Dec_A follows the second pre-decoded voltage Dec_B.

As shown in FIG. 12C, when the program voltage is applied to the 31st global word line GWL_P1<31> and the local self-boosting option is applied to the 29th, 30th, 32nd, and 33rd global word lines GWL_P1<29>, GWL_P1<30>, GWL_P1<32>, and GWL_P1<33>, the plane switching unit 350 may swap the order of the first pre-decoded voltage Dec_A and the second pre-decoded voltage Dec_B and output them. More specifically, since the first plane is operating, the first plane switch 351 may swap the order of the first pre-decoded voltage Dec_A and the second pre-decoded voltage Dec_B and output them.

First, the selected voltage switching unit 311 may decode and output the selected voltages VSEL<1:32>. More specifically, the first switch SSW1 may output the second local self-boosting voltage VLSB2 as the first selected voltage VSEL<1>. The first selected voltage VSEL<1> may be supplied to the 33rd global word line GWL_P1<33>. In addition, the second to 28th switches SSW2 to SSW28 may output the pass voltage VPASS as the second to 28th selected voltages VSEL<2> to VSEL<28>, respectively. More specifically, the 29th switch SSW29 may output the second local self-boosting voltage VLSB2 as the 29th selected voltage VSEL<29>. The 30th and 32nd switches SSW30 and SSW32 may output the first local self-boosting voltage VLSB1 as the 30th and 32nd selected voltages VSEL<30> and VSEL<32>, respectively. The 31st switch SSW31 may output the program voltage VPGM as the 31st selected voltage VSEL<31>.

During a program operation of the 31st local word line, the first plane switch 351 shown in FIG. 9 may swap the order of the first pre-decoded voltage Dec_A and the second pre-decoded voltage Dec_B and output them. In response to the control signals CTRL_SEL<1> and CTRL_UN<1>, a first selected switch SW_SWL<1> may be deactivated and the first unselected switch SW_UN<1> may be activated. Thus, the pass voltage VPASS which is the unselected voltage UN may be output to the first to 16th global word lines GWL_P1<1:16>. In response to the control signals CTRL_SEL<2> and CTRL_UN<2>, the second selected switch SW_SWL<2> may be activated and the second unselected switch SW_UN<2> may be deactivated. Therefore, the 17th to 32nd selected voltages VSEL<17:32> may be output to the 17th to 32nd global word lines GWL_P1<17:32>. In response to the control signals CTRL_SEL<3> and CTRL_UN<3>, the third selected switch SW_SWL<3> may be activated and the third unselected switch SW_UN<3> may be deactivated. Therefore, the first to 16th selected voltages VSEL<1:16> may be output to the 33rd to 48th global word lines GWL_P1<33:48>. In response to the control signals CTRL_SEL<4:12> and CTRL_UN<4:12>, the fourth to 12th selected switches SW_SWL<4:12> may be deactivated, and the fourth to 12th unselected switches SW_UN<4:12> may be activated. Therefore, the pass voltage VPASS which is the unselected voltage VU may be output to the 49th to 192nd global word lines GWL_P1<49:192>.

As shown in FIGS. 12B and 12C, the order of the first pre-decoded voltage Dec_A and the second pre-decoded voltage Dec_B may be swapped. In other words, as shown in FIG. 12B, the decoding operation may be performed in a sequential order of the first pre-decoded voltage Dec_A and the second pre-decoded voltage Dec_B, whereas as shown in FIG. 12C, the decoding operation may be performed in a sequential order of the second pre-decoded voltage Dec_B and the first pre-decoded voltage Dec_A. Therefore, unlike the global word line decoder shown in FIGS. 2 to 5, the global word line decoder shown in FIGS. 6 to 9 may efficiently transfer a self-boosting voltage when the local self-boosting option is applied. In terms of a window, when the selected voltage window is adjacent to the edge of the second pre-decoding window, the order of the first pre-decoded voltage Dec_A and the second pre-decoded voltage Dec_B may be swapped.

FIGS. 12D, 12E, and 12F show a decoding operation of a global word line during program operations of 34th, 46th, and 47th local word lines, respectively. Referring to FIGS. 12D to 12F, when the program operation is performed on the 47th local word line (FIG. 12F), the first pre-decoded voltage and the second pre-decoded voltage may be swapped again. In other words, as shown in FIG. 12E, when the selected voltage window is adjacent to the edge of the first pre-decoding window, the order of the first pre-decoded voltage Dec_A and the second pre-decoded voltage Dec_B may be swapped and decoded as shown in FIG. 12F.

As shown in FIGS. 12A to 12F, when the "selected voltage window" is adjacent to the edge of the "first pre-decoding window" or the "second pre-decoding window," the order of the first pre-decoded voltage Dec_A and the second pre-decoded voltage Dec_B may be swapped. However, this is only an example, and the order of the first pre-decoded voltage Dec_A and the second pre-decoded voltage Dec_B may be swapped at various time points or in various conditions.

For example, referring to FIGS. 12B and 12C, when the selected voltage window is adjacent to the edge of the second pre-decoding window, the order of the first pre-decoded voltage Dec_A and the second pre-decoded voltage Dec_B may be swapped. However, the order of the first pre-decoded voltage Dec_A and the second pre-decoded voltage Dec_B may be swapped only when the selected voltage window is located in the second pre-decoding window. For example, unlike FIG. 12B, when the selected voltage window corresponds to the 17th to 21st selected voltages VSEL<17:21>, the order of the first pre-decoded voltage Dec_A and the second pre-decoded voltage Dec_B may be swapped. In other words, when the program voltage VPGM is supplied to the 19th global word line GWL_P1<19>, and the local self-boosting voltage is supplied to the 17th, 18th, 20th, and 21st global word lines GWL_P1<17:18> and GWL_P1<20:21>, the pass voltage VPASS may be supplied as the unselected voltage VUN to the first to 16th global word lines GWL_P1<1:16>. In addition, the pass voltage which is the first to 16th selected voltages VSEL<1:16> as the first pre-decoded voltage Dec_A may be supplied to the 33rd to 48th global word lines GWL_P1<33:48>.

Based on the above description, the first pre-decoded voltage Dec_A and the second pre-decoded voltage Dec_B may be swapped at any suitably set time point when the "selected voltage window" exists within the "first pre-decoding window" or at any suitably set time point when the "selected voltage window" exists within the "second pre-decoding window." As described above, the time point or the condition for the order of the first pre-decoded voltage Dec_A and the second pre-decoded voltage Dec_B being swapped may be variously determined.

As described above, the global word line decoder and the semiconductor device having the same according to one or more exemplary embodiments of the invention may reduce the number of lines between the voltage switching unit 310 and the plane switching unit 350. In addition, the number of switches included in the global word line switch may be reduced. Therefore, since the number of switches and the number of lines are reduced, the chip area and manufacturing costs may be reduced. Moreover, the selected voltages may be efficiently supplied to the global word line when the local self-boosting option is applied.

Figure 13:
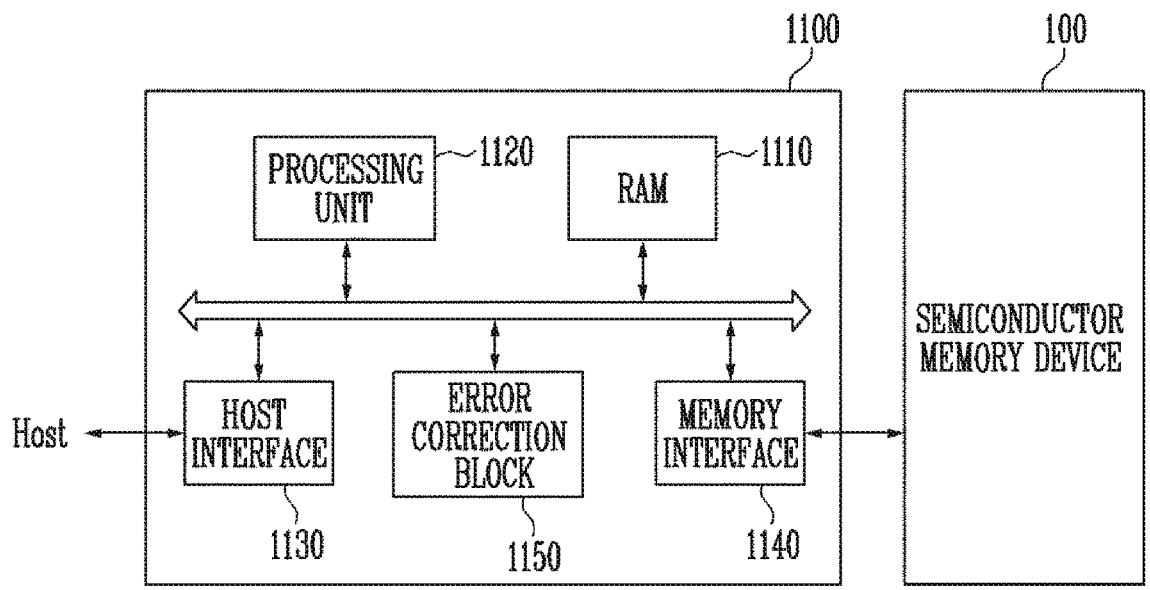
FIG. 13 is a block diagram illustrating a memory system including a semiconductor device shown in FIG.

FIG. 13 is a block diagram illustrating a memory system including the semiconductor memory device 100.

Referring to FIG. 13, the memory system 1000 may include the semiconductor memory device 100 and a controller 1100. The semiconductor memory device 100 may be one example of the semiconductor device described with reference to FIG. 1. Hereinafter, overlapping descriptions will be omitted.

The controller 1100 may be coupled to a host and the semiconductor memory device 100. The controller 1100 may be configured to access the semiconductor memory device 100 in response to a request from the host. For example, the controller 1100 may control a read operation, a program operation, an erase operation, and/or a background operation of the semiconductor memory device 100. The controller 1100 may be configured to provide an interface between the semiconductor memory device 100 and the host. The controller 1100 may be configured to drive firmware for controlling the semiconductor memory device 100.

The controller 1100 may include a random access memory (RAM) 1110, a central processing unit (CPU) 1120, a host interface 1130, a memory interface 1140 and an error correction block 1150. The RAM 1110 may be used as at least one of an operation memory of the processing unit 1120, a cache memory between the semiconductor memory device 100 and the host, and a buffer memory between the semiconductor memory device 100 and the host. The processing unit 1120 may control overall operations of the controller 1100. In addition, the controller 1100 may temporarily store program data provided from the host during a write operation.

The host interface 1130 may interface with the host. For example, the controller 1100 may communicate with the host through various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

The memory interface 1140 may interface with the semiconductor memory device 100. For example, the memory interface may include a NAND interface or a NOR interface.

The error correction block 1150 may detect and correct errors included in data read from the memory device 1200 by using error correction codes (ECCs). The processing unit 1120 may control a read voltage according to an error detection result of the error correction block 1150 and control the semiconductor memory device 100 to perform re-read. According to an exemplary embodiment, the error correction block 1150 may be provided as one of the components of the controller 1100.

The controller 1100 and the semiconductor memory device 100 may be integrated into a single semiconductor device. In an exemplary embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into a single semiconductor device to form a solid state drive SSD. The solid state drive SSD may include a storage device configured to store data in a semiconductor memory. When the memory system 1000 is used as the solid state drive SSD, an operation speed of the host coupled to a memory system 2000 may be remarkably improved.

In another example, the memory system 1000 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture player, a digital picture recorder, a digital video recorder, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an exemplary embodiment, the semiconductor memory device 100 or the memory system 1000 may be embedded in packages if various forms. For example, the semiconductor memory device 100 or the memory system 1000 may be embedded in packages such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multichip package (MCP), a wafer-level fabricated package (WFP), a wafer-level processed stack package (WSP), or the like.

Figure 14:
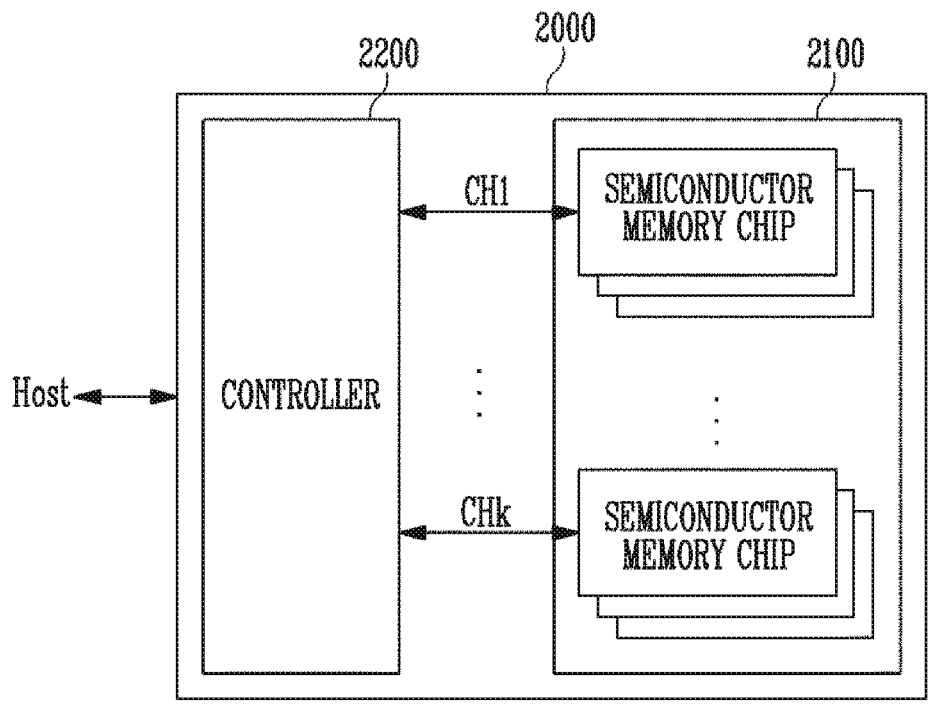
FIG. 14 is a block diagram illustrating an application example of a memory system shown in FIG. 13.

FIG. 14 is a block diagram illustrating an application example (2000) of the memory system 1000 shown in FIG. 13.

Referring to FIG. 14, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

FIG. 14 illustrates the plurality of groups communicating with the controller 2200 through first to k-th channels CH1 to CHk. Each of the memory chips may be configured and operated in a similar manner to the semiconductor memory device 100 described with reference to FIG. 1 or 2.

Each group may be configured to communicate with the controller 2200 over a single common channel. The controller 2200 may be configured similarly to the controller 200 or 100 described with reference to FIG. 1 or 14 and configured to control the plurality of memory chips of the semiconductor memory device 2100 through the plurality of channels CH1 to CHk.

Figure 15:
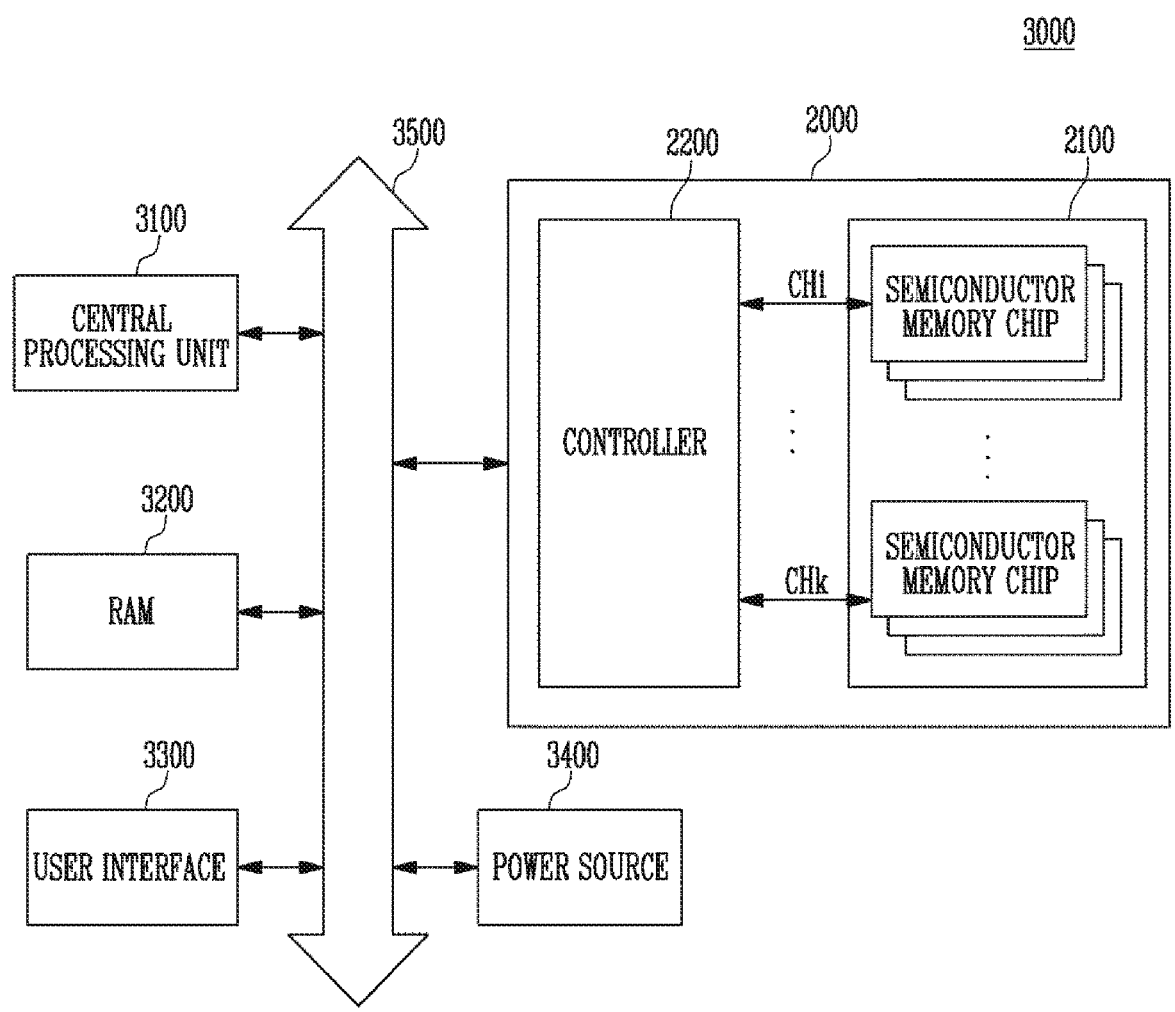
FIG. 15 is a block diagram illustrating a computing system including a memory system described with reference to FIG. 14.

FIG. 15 is a block diagram illustrating a computing system including a memory system described with reference to FIG. 14.

The computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

As shown in FIG. 15, the semiconductor memory device 2100 may be coupled to the system bus 3500 through the controller 2200. However, the semiconductor memory device 2100 may be directly coupled to the system bus 3500. The function of the controller 2200 may be performed by the central processing unit 3100 and the RAM 3200.

As shown in FIG. 15, the memory system 2000 described with reference to FIG. 14 may be provided. However, the memory system 2000 may be replaced with the memory system 1000 described with reference to FIG. 13. As an exemplary embodiment, the computing system 3000 may be configured to include all of the memory systems 1000 and 2000 described with reference to FIGS. 13 and 14.

According to an embodiment, a decoder capable of reducing the chip size may be provided.

According to another embodiment, a semiconductor device capable of reducing the chip size may be provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A decoder comprising:
a voltage switching unit configured to decode a plurality of operating voltages to a first pre-decoded voltage, a second pre-decoded voltage and an unselected voltage; and
a plane switching unit configured to select a plane among a plurality of planes, each plane including a plurality of memory blocks, and to output each of the first pre-decoded voltage, the second pre-decoded voltage and the unselected voltage to at least one global word line among global word lines coupled to the selected plane,
wherein the plane switching unit determines target global word lines to which the first pre-decoded voltage and the second pre-decoded voltage are applied, among the global word lines according to a position of a selected word line among the global word lines.

2. The decoder of claim 1, wherein the voltage switching unit comprises:
a selected voltage switching unit configured to generate the first pre-decoded voltage and the second pre-decoded voltage based on the plurality of operating voltages; and
an unselected voltage switching unit configured to generate the unselected voltage based on the plurality of operating voltages.

3. The decoder of claim 2, wherein the selected voltage switching unit outputs the plurality of operating voltages for a boosting option during a program operation.

4. The decoder of claim 2, wherein the plane switching unit includes a plurality of selected switches, and
each of the plurality of selected switches receives either of the first pre-decoded voltage and the second pre-decoded voltage.

5. The decoder of claim 4, wherein first selected switches corresponding to odd-numbered selected switches of the plurality of the selected switches receive the first pre-decoded voltage, and
second selected switches corresponding to even-numbered selected switches of the plurality of selected switches receive the second pre-decoded voltage.

6. The decoder of claim 5, wherein the plane switching unit further includes a plurality of unselected switches corresponding to the plurality of selected switches, respectively.

7. The decoder of claim 6, wherein the plane switching unit repeatedly swaps the order of the first pre-decoded voltage and the second pre-decoded voltage so that the first selected switches and the second selected switches receive the first pre-decoded voltage and the second pre-decoded voltage alternately.

8. The decoder of claim 1, wherein the plane switching unit swaps the order of the first pre-decoded voltage and the second pre-decoded voltage when a selected voltage window is adjacent to an edge of a first pre-decoding window, and
the selected voltage window corresponds to a selected voltage, and the first pre-decoding window corresponds to the first pre-decoded voltage.

9. The decoder of claim 1, wherein the plane switching unit swaps the order of the first pre-decoded voltage and the second pre-decoded voltage when a selected voltage window is adjacent to an edge of a second pre-decoding window, and
the selected voltage window corresponds to a selected voltage, and the second pre-decoding window corresponds to the second pre-decoded voltage.

10. A semiconductor device, comprising:
- a voltage generator configured to generate a plurality of operating voltages having different levels;
- a voltage switching unit configured to decode the plurality of operating voltages to a first pre-decoded voltage, a second pre-decoded voltage and an unselected voltage;
- a plane switching unit configured to select a plane among a plurality of planes, each plane including a plurality of memory blocks, and to output each of the first pre-decoded voltage, the second pre-decoded voltage and the unselected voltage to at least one a global word line among a plurality of global word lines coupled to the selected plane; and
- a control logic controlling operations of the voltage generator, the voltage switching unit, and the plane switching unit,
- wherein the plane switching unit determines target global word lines to which the first pre-decoded voltage and the second pre-decoded voltage are applied, among the plurality of global word lines according to a position of a selected word line among the plurality of global word lines.

11. The semiconductor device of claim 10, wherein the voltage switching unit comprises:
- a selected voltage switching unit configured to generate the first pre-decoded voltage and the second pre-decoded voltage based on the plurality of operating voltages; and
- an unselected voltage switching unit configured to generate the unselected voltage based on the plurality of operating voltages.

12. The semiconductor device of claim 11, wherein the selected voltage switching unit outputs the plurality of operating voltages for a boosting option during a program operation.

13. The semiconductor device of claim 11, wherein the plane switching unit includes a plurality of selected switches, and
- each of the plurality of selected switches receives either of the first pre-decoded voltage and the second pre-decoded voltage.

14. The semiconductor device of claim 13, wherein first selected switches corresponding to odd-numbered selected switches, among the plurality of selected switches, receive the first pre-decoded voltage, and
- second selected switches corresponding to even-numbered selected switches, among the plurality of selected switches, receive the second pre-decoded voltage.

15. The semiconductor device of claim 14, wherein the plane switching unit further comprises a plurality of unselected switches corresponding to the plurality of selected switches, respectively.

16. The semiconductor device of claim 15, wherein the plane switching unit repeatedly swaps the order of the first pre-decoded voltage and the second pre-decoded voltage so that the first selected switches and the second selected switches receive the first pre-decoded voltage and the second pre-decoded voltage alternately.

17. The semiconductor device of claim 10, wherein the plane switching unit swaps the order of the first pre-decoded voltage and the second pre-decoded voltage when a selected voltage window is adjacent to an edge of a first pre-decoding window, and
- the selected voltage window corresponds to a selected voltage, and the first pre-decoding window corresponds to the first pre-decoded voltage.

18. The semiconductor device of claim 10, wherein the plane switching unit swaps the order of the first pre-decoded voltage and the second pre-decoded voltage when a selected voltage window is adjacent to an edge of a second pre-decoding window, and
- the selected voltage window corresponds to a selected voltage, and the second pre-decoding window corresponds to the second pre-decoded voltage.

19. A decoder comprising:
- a voltage switching unit configured to decode a plurality of operating voltages to an unselected voltage, a first pre-decoded voltage and a second pre-decoded voltage; and
- a plane switching unit configured to select a plane among a plurality of planes, each plane including a plurality of memory blocks, and to output each of the unselected voltage, the first pre-decoded voltage and the second pre-decoded voltage to at least on a global word line among global word lines coupled to the selected plane,
- wherein the plane switching unit includes groups of switches, a first group of switches receiving the first pre-decoded voltage, a second group of switches receiving the second pre-decoded voltage, a third group of switches receiving the first pre-decoded voltage, and
- wherein either the first group of switches or the third group of switches alternatively outputs the first pre-decoded voltage according to a position of a selected word line.

* * * * *